United States Patent
Ju et al.

(10) Patent No.: US 12,266,704 B2
(45) Date of Patent: Apr. 1, 2025

(54) SEMICONDUCTOR DEVICES INCLUDING HORIZONTAL GATE-ALL-AROUND (hGAA) NANOSTRUCTURE TRANSISTORS AND METHODS OF FORMING

(71) Applicant: Taiwan Semiconductor Manufacturing Co., Ltd., Hsinchu (TW)

(72) Inventors: Shi Ning Ju, Hsinchu (TW); Guan-Lin Chen, Baoshan Township (TW); Kuo-Cheng Chiang, Zhubei (TW); Chih-Hao Wang, Baoshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/324,682

(22) Filed: May 26, 2023

(65) Prior Publication Data

US 2023/0299159 A1    Sep. 21, 2023

Related U.S. Application Data

(63) Continuation of application No. 17/712,605, filed on Apr. 4, 2022, now Pat. No. 11,699,729, which is a continuation of application No. 16/871,993, filed on May 11, 2020, now Pat. No. 11,296,199.

(60) Provisional application No. 62/927,531, filed on Oct. 29, 2019.

(51) Int. Cl.
*H01L 29/417* (2006.01)
*H01L 21/8234* (2006.01)
*H01L 29/66* (2006.01)
*H01L 29/78* (2006.01)

(52) U.S. Cl.
CPC .......... *H01L 29/41791* (2013.01); *H01L 21/823431* (2013.01); *H01L 29/66795* (2013.01); *H01L 29/785* (2013.01); *H01L 2029/7858* (2013.01)

(58) Field of Classification Search
CPC ......... H01L 29/41791; H01L 29/42392; H01L 29/66795; H01L 29/785; H01L 29/0676; H01L 21/823431; H01L 2029/7858; H01L 29/78696
See application file for complete search history.

(56) References Cited

U.S. PATENT DOCUMENTS

| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |

(Continued)

*Primary Examiner* — Changhyun Yi
(74) *Attorney, Agent, or Firm* — Slater Matsil, LLP

(57) ABSTRACT

Semiconductor devices and their manufacturing methods are disclosed herein, and more particularly to semiconductor devices including a transistor having gate all around (GAA) transistor structures and manufacturing methods thereof. The methods described herein allow for complex shapes (e.g., "L-shaped") to be etched into a multi-layered stack to form fins used in the formation of active regions of the GAA nanostructure transistor structures. In some embodiments, the active regions may be formed with a first channel width and a first source/drain region having a first width and a second channel width and a second source/drain region having a second width that is less than the first width.

20 Claims, 21 Drawing Sheets

(56) References Cited

U.S. PATENT DOCUMENTS

| | | |
|---|---|---|
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 2009/0026543 A1* | 1/2009 | Yang .............. H01L 29/785 |
| | | 257/E21.616 |
| 2017/0256609 A1 | 9/2017 | Bhuwalka et al. |
| 2018/0286764 A1 | 10/2018 | Rodder et al. |
| 2019/0081155 A1 | 3/2019 | Xie et al. |
| 2019/0305085 A1 | 10/2019 | Sung et al. |

\* cited by examiner

SEMICONDUCTOR DEVICES INCLUDING HORIZONTAL GATE-ALL-AROUND (hGAA) NANOSTRUCTURE TRANSISTORS AND METHODS OF FORMING

PRIORITY CLAIM AND CROSS-REFERENCE

This application is a continuation of U.S. application Ser. No. 17/712,605, filed on Apr. 4, 2022, which is a continuation of U.S. application Ser. No. 16/871,993, filed May 11, 2020, now U.S. Pat. No. 11,296,199, issued on Apr. 5, 2022, which claims the benefit of U.S. Provisional Application No. 62/927,531, filed on Oct. 29, 2019, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
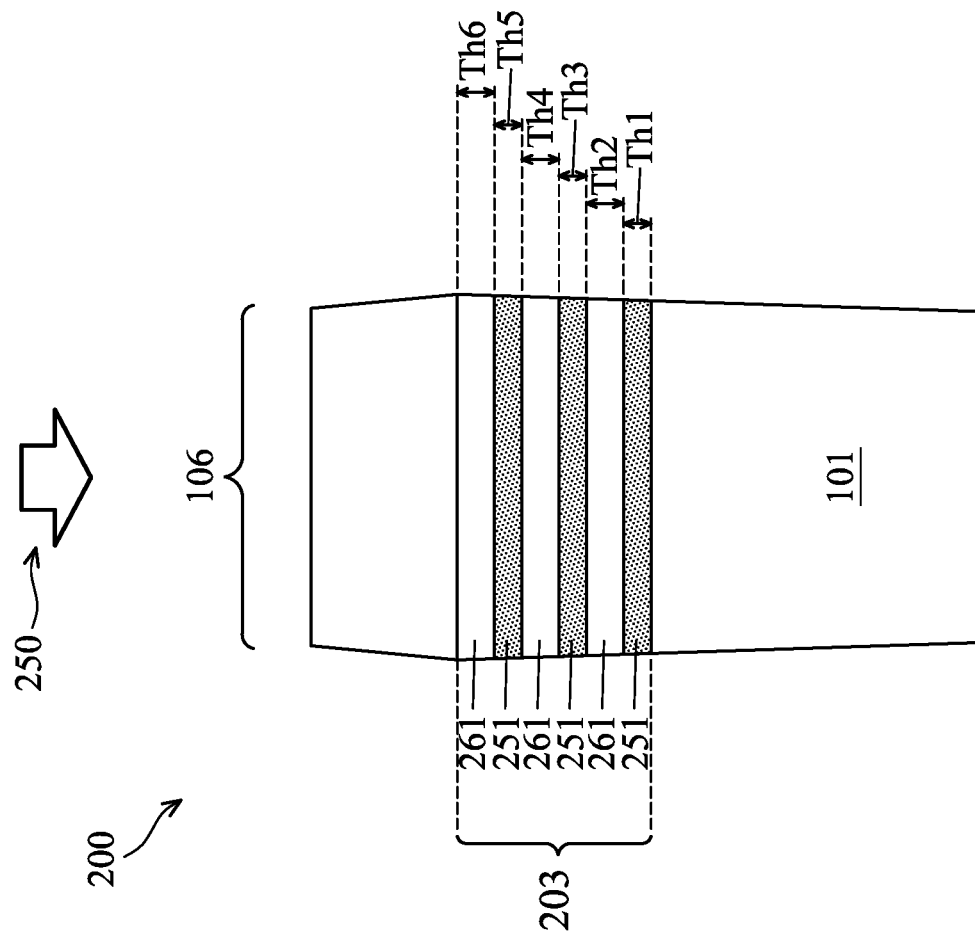
FIGS. 1-12 illustrate intermediate steps in forming a gate-all-around (GAA) active device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to the integration of horizontal gate-all-around (GAA) nanostructure transistors for use in the design and operation of integrated circuits in the 3 nm technology node and below. Such embodiments allow for complex shapes (e.g., "L-shapes") to be formed in active regions of the GAA nanostructure transistors. According to the embodiments described herein, the GAA nanostructure transistors may be formed with a first channel width and a first source/drain region having a first width and a second channel width and a second source/drain region having a second width that is less than the first width. As such, the GAA nanostructure transistors may be constructed with a complex active region (e.g., "L-shapes") that provides power savings during operation and offers a flexible design which may be applied in various cell-type configurations. However, embodiments may be utilized in a wide variety of ways, and are not intended to be limited to the embodiments described herein.

With reference now to FIG. 1, there is illustrated a perspective view of a deposition process 250 onto a substrate 101, in accordance with some embodiments, to form a multi-layer active device 200 in an intermediate stage of manufacturing the gate all-around (GAA) transistor. In an embodiment the substrate 101 is a semiconductor substrate, which may be, for example, a silicon substrate, a silicon germanium substrate, a germanium substrate, a III-V material substrate (e.g., GaAs, GaP, GaAsP, AlInAs, AlGaAs, GaInAs, InAs, GaInP, InP, InSb, and/or GaInAsP; or a combination thereof), or a substrate formed of other semiconductor materials with, for example, high band-to-band tunneling (BTBT). Substrate 101 may be doped or undoped. In some embodiments, substrate 101 may be a bulk semiconductor substrate, such as a bulk silicon substrate that is a wafer, a semiconductor-on-insulator (SOI) substrate, a multi-layered or gradient substrate, or the like. The substrate 101 may have dopants implanted in order to form wells for the formation of active devices.

FIG. 1 further illustrates that the substrate 101 comprises a first device region 106 for forming n-type devices, such as NMOS transistors (e.g., n-type gate all around transistors), although the first device region 106 may be used for forming p-type devices, such as PMOS transistors (e.g., p-type gate all around transistors). Although FIG. 1 is illustrated as a single device region, it is understood that the first device region 106 is merely representative of a single area formed within a semiconductor wafer and the semiconductor wafer may comprise many device regions. The many device regions may be formed as pluralities of the first device region 106 and/or pluralities of other device regions different from the first device region 106.

FIG. 1 further illustrates a series of depositions that are performed to form a multi-layer stack 203 of alternating materials of first layers 251 and second layers 261 over the substrate 101. According to some embodiments, the deposition process 250 comprises forming a first layer 251 of semiconductor material with a first lattice constant, such as SiGe, Ge, Si, GaAs, InSb, GaSb, InAlAs, InGaAs, GaSbP, GaAsSb, combinations of these, or the like. In some embodiments, the first layer 251 is epitaxially grown on the substrate 101 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), a combination thereof, or the like, may also be utilized. In some embodiments, the first layer 251 is formed to a first thickness Th1 of between about 4 nm and about 15 nm, such as about 10 nm. However, any suitable thickness may be utilized while remaining within the scope of the embodiments.

Once the first layer 251 has been formed over the substrate 101, the second layer 261 may be formed over the first layer 251. According to some embodiments, the second layer 261 may be a second semiconductor material such as Si, SiGe, Ge, GaAs, InSb, GaSb, InAlAs, InGaAs, GaSbP, GaAsSb, combinations of these, or the like, with a different lattice constant than the material of the first layer 251. In a particular embodiment in which the first layer 251 is silicon germanium, the second layer 261 is a material with a different lattice constant, such as silicon. However, any suitable combination of materials may be utilized.

In some embodiments, the second layer 261 is epitaxially grown on the first layer 251 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), a combination thereof, or the like, may also be utilized. The second layer 261 is formed to a second thickness Th2 of between about 4 nm and about 10 nm, such as about 7 nm. However, any suitable material and any suitable thickness may be used.

Once the second layer 261 has been formed over the first layer 251, the deposition process 250 is repeated to form the remaining material layers in the series of alternating materials of the first layers 251 and the second layers 261 until a desired topmost layer of the multi-layer stack 203 has been formed. In a particular embodiment, another first layer 251 is formed to a third thickness Th3, another second layer 261 is formed to a fourth thickness Th4, another first layer 251 is formed to a fifth thickness Th5, and another second layer 261 is formed to a sixth thickness Th6. Furthermore, the sheet spacing between the second layers 261 are substantially equal to the thicknesses of the first layers 251 (e.g., Th1, Th3, and Th5). According to the present embodiment, the topmost layer of the multi-layer stack 203 is formed as a second layer 261; however, in other embodiments, the topmost layer of the multi-layer stack 203 may be formed as a first layer 251. Additionally, although embodiments are disclosed herein comprising three first layers 251 and three second layers 261, the multi-layer stack 203 may have any suitable number of layers (e.g., nanosheets). For example, the multi-layer stack 203 may comprise multiple nanosheets in a range between 2 to 10 nanosheets. In some embodiments, the multi-layer stack 203 may comprise equal numbers of first layers 251 to second layers 261; however, in other embodiments, the number of first layers 251 may be different from the number of second layers 261.

According to some embodiments, the first layers 251 of the multi-layer stack 203 are formed to be substantially a same thickness (e.g., the first thickness Th1~the third thickness Th3~the fifth thickness Th5) and the thicknesses of the second layers 261 of the multi-layer stack 203 are formed to substantially a same thickness (e.g., the second thickness Th2~the fourth thickness Th4~the sixth thickness Th6). However, the thicknesses of the first layers 251 may be different thicknesses from one another and/or the thickness of the second layers 261 may be different thickness from one another. Any suitable thicknesses may be used.

Figure 2:
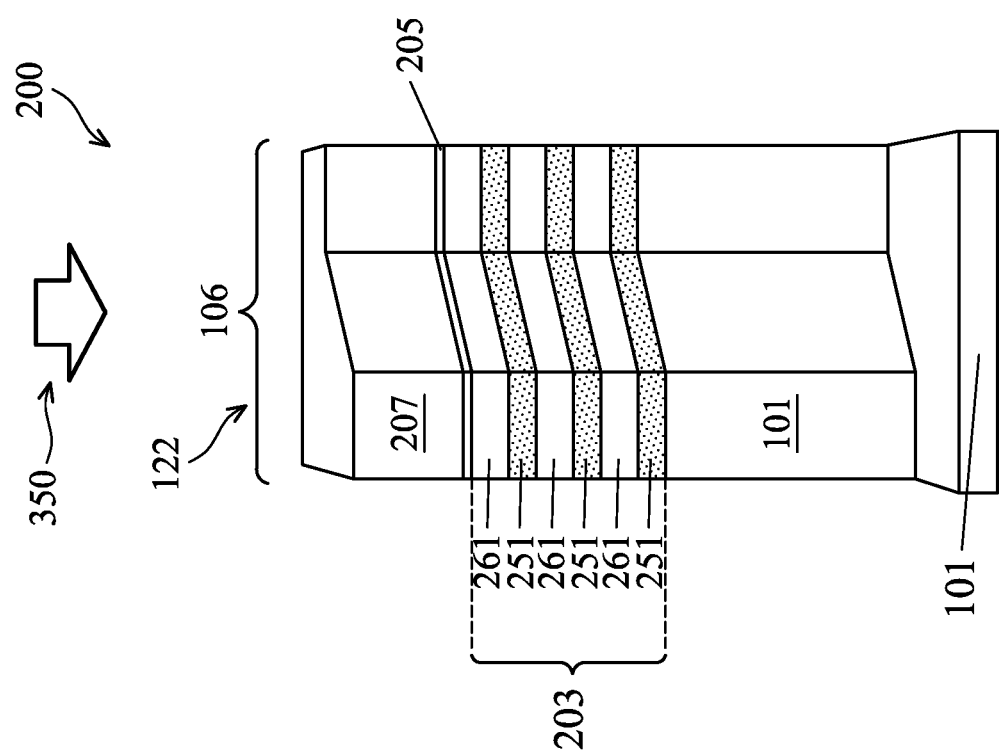

With reference now to FIG. 2, there is illustrated a patterning process 350 of the multi-layer active device 200 in an intermediate stage of manufacturing Gate All-Around (GAA) transistors, in accordance with some embodiments. The patterning process 350 may be utilized in an oxide definition step for transferring a desired shape (e.g., an "L-shaped" pattern) into the multi-layered stack 203 and substrate 101.

Once the multi-layer stack 203 has been formed over the substrate 101, the multi-layer stack 203 and substrate 101 may be patterned into a desired shape (e.g., "L-shape"), according to some embodiments. The patterning may be performed by initially forming a first hard mask 205 and a second hard mask 207 over the first hard mask 205. The first hard mask 205 comprises a dielectric material such as silicon oxide, silicon nitride, titanium nitride, silicon oxynitride, combinations of these, or the like. The first hard mask 205 may be formed using a process such as chemical vapor deposition, plasma enhanced chemical vapor deposition, atomic layer deposition, or the like. However, any other suitable material and method of formation may be utilized. The first hard mask 205 may be formed to a thickness of between about 20 Å and about 3000 Å, such as about 20 Å.

The second hard mask 207 comprises a separate dielectric material such as silicon nitride, silicon oxide, titanium nitride, silicon oxynitride, combinations of these, or the like. The second hard mask 207 may be formed using a process such as chemical vapor deposition, plasma enhanced chemical vapor deposition, atomic layer deposition, or the like. However, any other suitable material and method of formation may be utilized. The second hard mask 207 may be formed to a thickness of between about 20 Å and about 3,000 Å, such as about 20 Å.

Once the first hard mask 205 and the second hard mask 207 have been formed, the first hard mask 205 and the second hard mask 207 may be patterned. In an embodiment the first hard mask 205 and the second hard mask 207 may be patterned by initially placing a photoresist (not individually illustrated) over the second hard mask 207 and exposing the photoresist to a patterned energy source (e.g., light, such as, extreme ultra-violet (EUV)) in order to initiate a chemical reaction that modifies the physical properties of the exposed portions of the first photoresist. The first photoresist may then be developed by applying a first developer (also not individually illustrated) in order to utilize the modified physical properties between the exposed region and the unexposed region to selectively remove either the exposed region or the unexposed region.

Once the photoresist has been patterned, the photoresist may be used as a mask in order to pattern the underlying second hard mask 207 and first hard mask 205. In an embodiment the second hard mask 207 and the first hard mask 205 may be patterned using, e.g., one or more reactive ion etching (RIE) processes with the photoresist as a mask. The patterning process may be continued until the multi-layer stack 203 is exposed beneath the first hard mask 205.

Once the first hard mask 205 and the second hard mask 207 have been patterned, the photoresist may be removed from the second hard mask 207. In an embodiment the photoresist may be removed utilizing, e.g., an ashing process, whereby a temperature of the photoresist is raised until the photoresist experiences a thermal decomposition and may be easily removed using one or more cleaning process. However, any other suitable removal process may be utilized.

Using the first hard mask 205 and the second hard mask 207 as a mask in an oxide definition step, one or more etching processes such as anisotropic etching processes (e.g., reactive ion etching (RIE)) may be performed to transfer the pattern of the mask (e.g., "L-shape") into the underlying layers to form a fin 122 in the multi-layer stack 203 and substrate 101. Although embodiments have been described as transferring an "L-shape" pattern into the multi-layer stack 203 and substrate 101 to form the fin 122, any suitable shapes may be utilized as is discussed in greater detail below. Furthermore, any suitable etching process and any suitable number of etching processes may be used in the oxide definition step to form the fin 122 in the multi-layer stack 203 and substrate 101.

Additionally, while a single mask process has been described to form the fin 122, this is intended to be illustrative and is not intended to be limiting, as the gate all around (GAA) transistor structures may be patterned by any suitable method and any suitable number of fins may be formed in the multi-layer stack 203 and substrate 101. For example, the structures may be patterned using one or more photolithography processes, including double-patterning or multi-patterning processes and many fins having the same "L-shape" pattern of the fin 122 or any other suitable shape may be formed. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin 122 in the multi-layer stack 203 and substrate 101.

Figure 3:
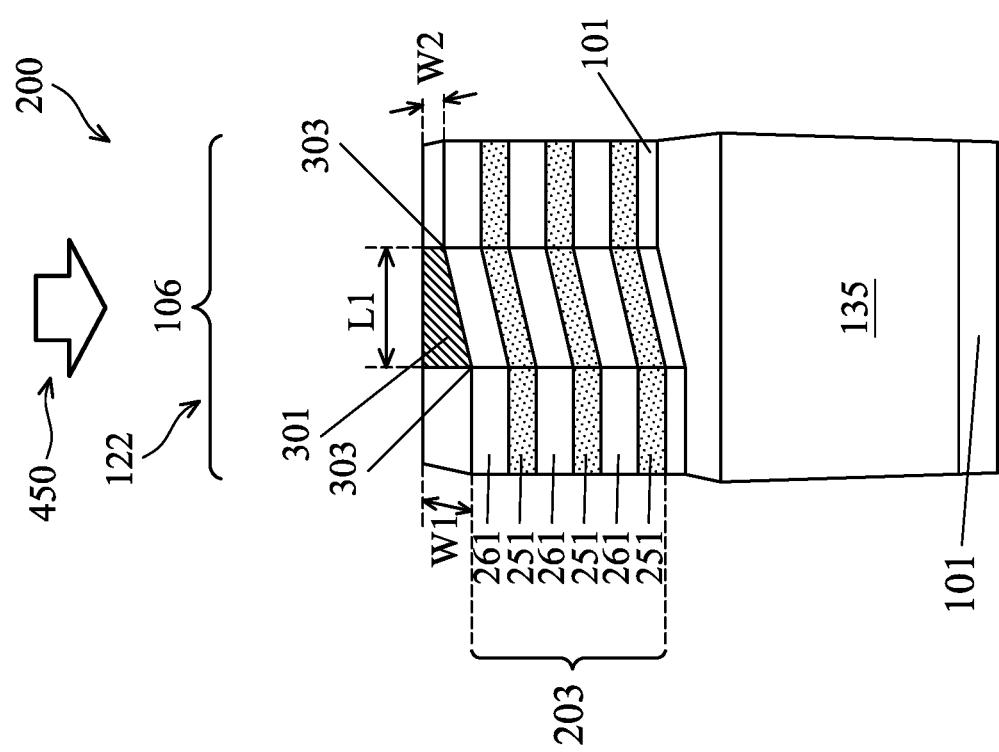

Turning to FIG. 3, after the formation of the fin 122, STI region 135 (e.g., shallow trench isolation region) is formed. In an embodiment, the STI region 135 may be formed by depositing a dielectric material such as an oxide material (e.g., a flowable oxide), high-density plasma (HDP) oxide, or the like. The dielectric material may be formed, after an optional cleaning and lining, using chemical vapor deposition (CVD) methods (e.g., the HARP process), high density plasma CVD methods, or other suitable methods of formation to fill or overfill the regions around the fin 122.

Once deposited, excess dielectric material of the STI region 135 may be removed through a suitable process such as chemical mechanical polishing (CMP), etching, a combination of these, or the like. In an embodiment, the removal process removes any dielectric material that is located over the fin 122 as well, so that the removal of the dielectric material will expose the surface of the fin 122 to further processing steps.

With the excess dielectric material of the STI region 135 having been removed, the dielectric material may then be recessed away from the surface of the fin 122 to form the STI region 135. The recessing may be performed to expose at least a portion of the sidewalls of the fin 122 adjacent to the top surface of the fin 122. The dielectric material of the STI region 135 may be recessed using a wet etch by dipping the top surface of the fin 122 into an etchant selective to the dielectric material, although other methods, such as a reactive ion etch, a dry etch, chemical oxide removal, or dry chemical clean may be used. In some embodiments, the dielectric material may be recessed below the bottommost layer of the first layers 251 to expose some of the substrate 101.

FIG. 3 further illustrates an active region 301 of the fin 122 having a first length L1 between corners 303 of the "L-shape." According to some embodiments, the first length L1 may be between about 8 nm and about 30 nm, such as about 10 nm. However, any suitable length may be used.

At distal ends of the active region 301, the fin 122 has a first width W1 and a second width W2 different from the first width W1. According to some embodiments, the second width W2 is less than the first width W1, although the second width W2 may also be greater than the first width W1. The first width W1 may be between about 8 nm and about 50 nm, such as about 30 nm. The second width W2 may be between about 8 nm and about 50 nm, such as about 10 nm. In some embodiments, a difference between the first width W1 and the second width W2 may be between about 2 nm and about 16 nm, such as about 10 nm, and a first ratio R1 between the first width W1 and the second width W2 which may be between about 4:1 and about 1.5:1, such as about 3:1. However, any suitable widths and any suitable ratios may be utilized.

Figure 4:
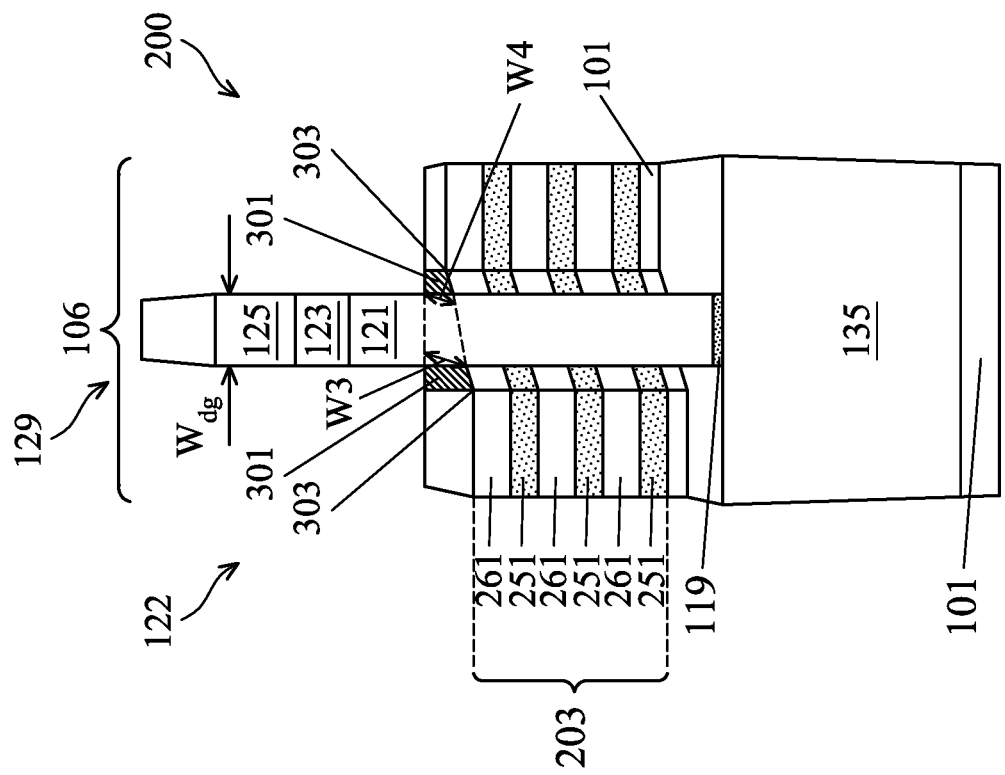

FIG. 4 illustrates the formation of a dummy gate stack 129 over the active region 301 and between the corners 303 of the "L-shape" in the fin 122. According to some embodiments, the dummy gate stack 129 comprises a dummy gate dielectric 119, a dummy gate electrode 121 over the dummy gate dielectric 119, a third hard mask 123 over the dummy gate electrode 121, and a fourth hard mask 125 over the third hard mask 123. FIG. 4 further illustrates a left-side interface between the dummy gate stack 129 and the active region 301 having a third width W3 and a right-side interface between the dummy gate stack 129 and the active region 301 having a fourth width W4.

In an embodiment the dummy gate dielectric 119 may be formed by thermal oxidation, chemical vapor deposition, sputtering, or any other methods known and used in the art for forming a gate dielectric. Depending on the technique of gate dielectric formation, the dummy gate dielectric 119 thickness on the top of the fin 122 may be different from the thickness of the dummy gate dielectric 119 on the sidewalls of the fin 122. The dummy gate dielectric 119 may comprise a material such as silicon dioxide or silicon oxynitride with a thickness ranging from about 3 angstroms to about wo angstroms, such as about 10 angstroms. In an embodiment the dummy gate dielectric 119 may be formed by first depositing a sacrificial layer of a material such as silicon in order to provide sidewall protection. Once the sacrificial layer has been formed the sacrificial material may be oxidized or nitridized and consumed in order to form a dielectric such as the silicon dioxide or silicon oxynitride. However, any suitable process may be utilized.

In other embodiments the dummy gate dielectric 119 may also be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 119.

The dummy gate electrode 121 may comprise a conductive material and may be selected from a group comprising polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrode 121 may be deposited by chemical vapor deposition (CVD), sputter deposition, or other techniques known and used in the art for depositing conductive materials. The thickness of the dummy gate electrode 121 may be in the range of about 5 Å to about 500 Å. The top surface of the dummy gate electrode 121 may have a non-planar top surface, and may be planarized prior to patterning of the dummy gate electrode 121 or the gate etch. Ions may or may not be introduced into the dummy gate electrode 121 at this point. Ions may be introduced, for example, by ion implantation techniques.

Once the dummy gate dielectric 119 and the dummy gate electrode 121 have been formed, the dummy gate dielectric 119 and the dummy gate electrode 121 may be patterned. In an embodiment the patterning may be performed by initially forming the third hard mask 123 and the fourth hard mask 125 over the third hard mask 123. The third hard mask 123 and the fourth hard mask 125 may be formed using any of the materials and processes suitable for forming the first hard mask 205 and the second hard mask 207, respectively. According to some embodiments, the third hard mask 123 is formed as a layer of silicon oxide to a thickness of between about 20 Å and about 3000 Å, such as about 20 Å and, in some embodiments, the fourth hard mask 125 may be formed as a layer of silicon nitride to a thickness of between about 20 Å and about 3000 Å, such as about 20 Å. However, any suitable materials and thickness may be used.

Once the third hard mask 123 and the fourth hard mask 125 have been formed, the third hard mask 123 and the fourth hard mask 125 may be patterned using any of the materials (e.g., photoresist) and processes (e.g., exposing and developing the photoresist, reactive ion etching (RIE), and the like) suitable for patterning the first hard mask 205 and the second hard mask 207, as set forth above. The patterning process may be continued until the dummy gate electrode 121 is exposed beneath the third hard mask 123.

Once the third hard mask 123 and the fourth hard mask 125 have been patterned, the photoresist may be removed from the third hard mask 123 and the fourth hard mask 125 (e.g., using an ashing process). However, any other suitable removal process may be utilized. Using the third hard mask 123 and the fourth hard mask 125 as a mask and using an anisotropic etching process (e.g., reactive ion etching (RIE)), the pattern of the third hard mask 123 and the fourth hard mask 125 is transferred to the dummy gate electrode 121 and the dummy gate dielectric 119 in order to form the dummy gate stack 129 over the fin 122, although any suitable process for transferring a pattern into dielectric layers, as set forth above with regard to the first hard mask 205 and the second hard mask 207 may also be utilized.

Once the dummy gate stack 129 has been formed, the upper surface and the sidewalls of the multi-layer stack 203 and the upper surface of the STI region 135 that are not protected by the dummy gate stack 129 are re-exposed. In an embodiment, the dummy gate stack 129 may be formed to cover a portion of the multi-layer stack 203 with a dummy gate width $W_{dg}$ that is less than first length L1, such has the dummy gate width $W_{dg}$ being between about 8 nm and about 16 nm, such as about 10 nm. As such, the dummy gate electrode will form a left-side interface and a right side interface with the multi-layer stack 203. According to some embodiments, the third width W3 of the active region 301 at the left-side interface may be between about 28 nm and about 34 nm, such as about 30 nm and the fourth width W4 of the active region 301 at the right-side interface may be between about 8 nm and about 12 nm, such as about 10 nm. However, any suitable widths may be used.

Figure 5:
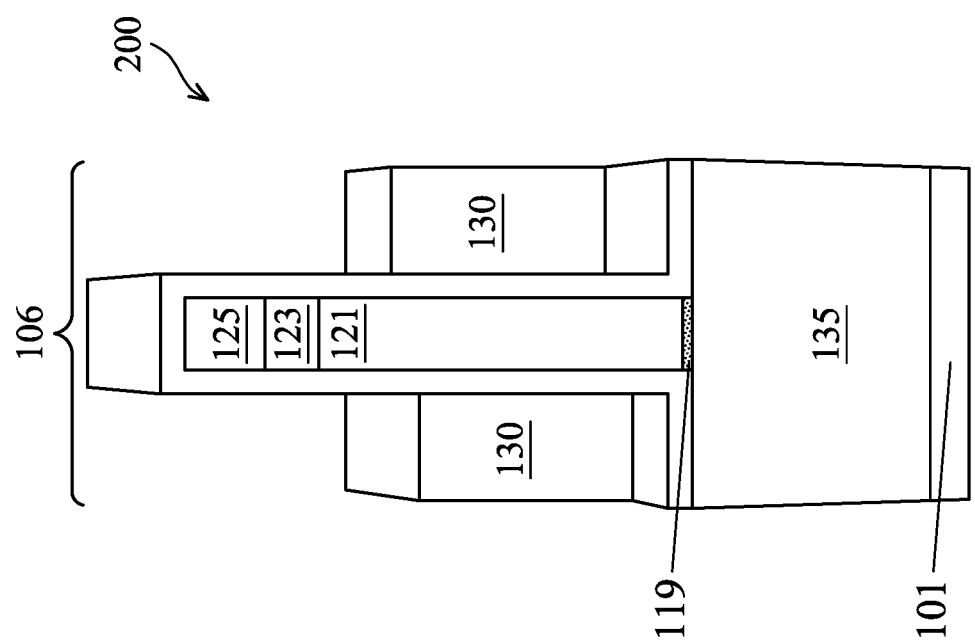

FIG. 5 illustrates the formation of a conformal dielectric layer 130, in accordance with some embodiments. The conformal dielectric layer 130 is deposited over the dummy gate stack 129, the fin 122, and the STI region 135 in an initial step of forming gate spacers 131 for a gate electrode 1103. As such, the conformal dielectric layer 130 is formed on opposing sides of the dummy gate stack 129 along sidewalls of the dummy gate dielectric 119, the dummy gate electrode 121, the third hard mask 123, and the fourth hard mask 125. The conformal dielectric layer 130 is also formed on opposing sides of the fin 122 along sidewalls of the first layers 251 and the second layers 261 and any exposed portions of the substrate 101. The portions of the active region 301 and the corners 303 of the "L-shape" in the fin 122 are disposed under the conformal dielectric layer 130 and are therefore not illustrated in FIG. 5.

The conformal dielectric layer 130 may be formed by blanket deposition on the multi-layer active device 200, according to some embodiments. The conformal dielectric layer 130 may comprise silicon oxide ($SiO_2$), silicon oxynitride (SiON), silicon nitride ($Si_3N_4$), silicon oxycarbide (SiOC), silicon oxycarbonitride (SiOCN), although any suitable material, such as low-k materials with a k-value less than about 4.0, or even an air gap, or combination thereof may be utilized. The conformal dielectric layer 130 may be formed by any suitable methods utilized to form such a layer, such as chemical vapor deposition (CVD), plasma enhanced CVD, sputter, and any other suitable methods.

Figure 6:
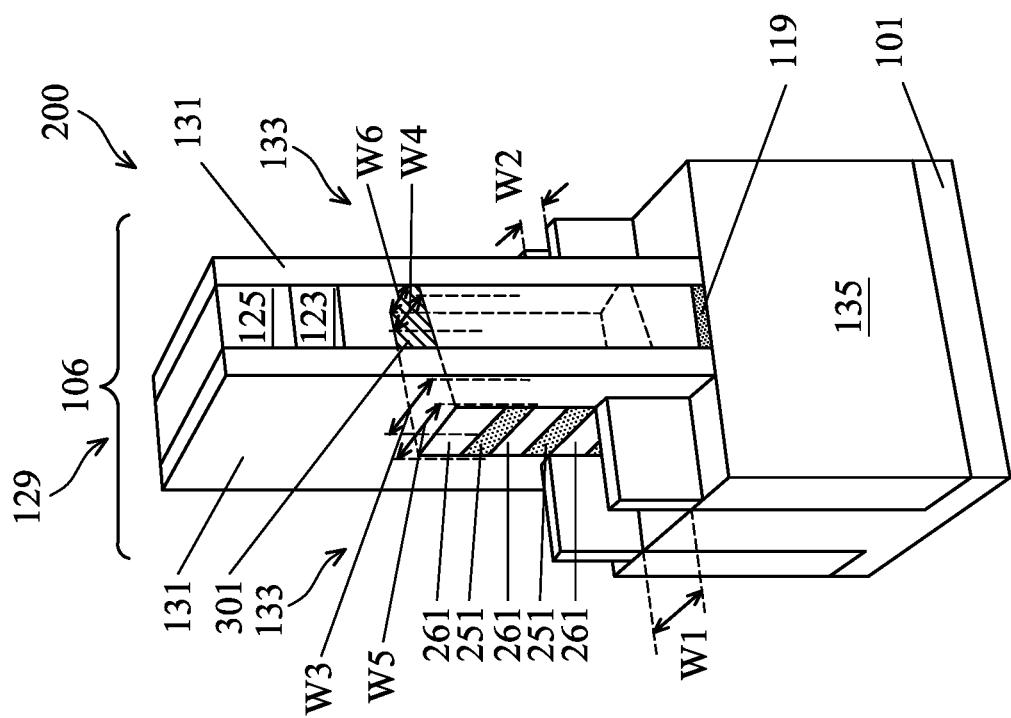

FIG. 6 illustrates an etching of horizontal surfaces of the conformal dielectric layer 130 in order to form the gate spacers 131 on the dummy gate stack 129. In an embodiment the gate spacers 131 may be formed using an anisotropic etching process such as a reactive ion etching (RIE) process. However, while the gate spacers 131 are described using a single layer as the conformal dielectric layer 130, this is intended to be illustrative and is not intended to be limiting. Rather, any number of layers and any combinations of deposition and removal processes may be used, and all such processes are fully intended to be included within the scope of the embodiments. Once the horizontal surfaces of the conformal dielectric layer 130 have been removed, the topmost surfaces of the fourth hard mask 125, the fin 122, and the STI region 135 that are not protected by the vertical sidewalls of the gate spacers 131 and the dummy gate stack 129 are re-exposed.

Once the gate spacers 131 have been formed, trenches 133 may be etched through the fin 122 using an etching process performed to remove materials of the fin 122 that are exposed on either side of the dummy gate stack 129 and are not protected by the sidewalls of the gate spacers 131. According to some embodiments, the trenches 133 may be etched using one or more anisotropic etches, such as reactive ion etches to etch through the fin 122 and may be formed with dimensions of the portions of the fins 122 that they displace.

In some embodiments, a first trench that is formed on a left side of the dummy gate stack 129 may be formed with the first width W1 at the distal end of the trench 133 from the exposed sidewall of the fin 122 and may be formed with a fifth width W5 at the exposed sidewall of the fin 122. The fifth width W5 is less than or equal to the first width W1 (e.g., between about 8 nm and about 50 nm, such as about 30 nm) and is greater than the third width W3 (e.g., between about 8 nm and about 50 nm, such as about 28 nm). However, any suitable widths may be utilized.

According to some embodiments, a second trench that is formed on a right side of the dummy gate stack 129 may be formed with the second width W2 at the distal end of the trench 133 from the exposed sidewall of the fin 122 and may be formed with a sixth width W6 at the exposed sidewall of the fin 122. The sixth width W6 is greater than or equal to the second width W2 (e.g., between about 8 nm and about 50 nm, such as about 10 nm) and is less than the fourth width W4 (e.g., between about 8 nm and about 50 nm, such as about 20 nm). However, any suitable widths may be utilized.

Figure 7:
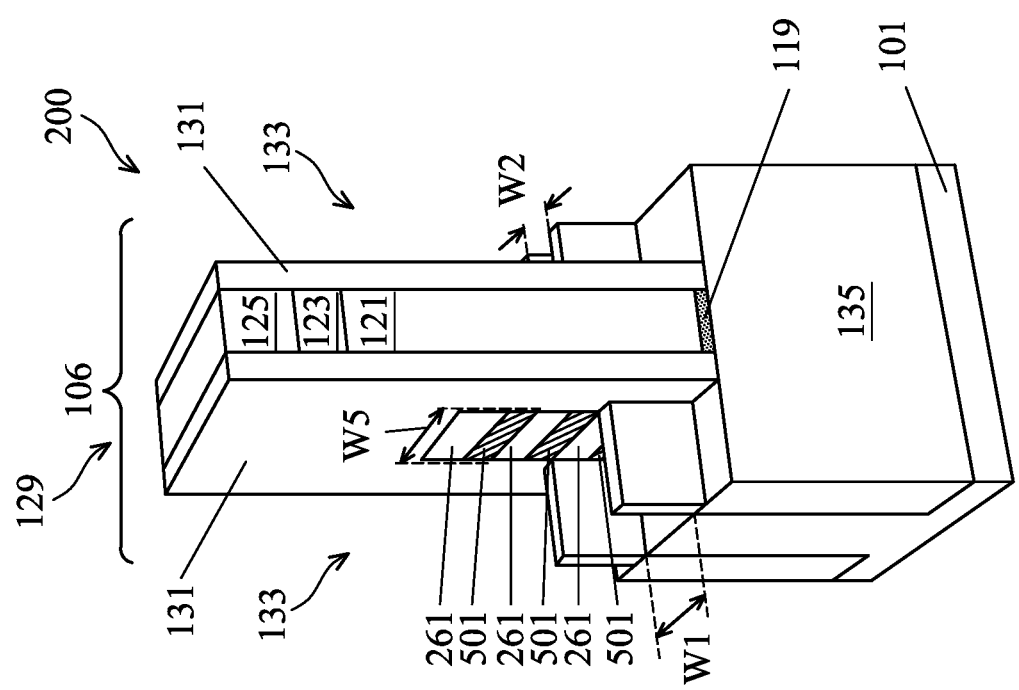

FIG. 7 illustrates formation of first inner spacers 501 in the first layers 251 (shown in FIG. 6) of the first device region 106. The first inner spacers 501 are formed in the recesses of the first layers 251 in the first device region 106. In some embodiments, the first inner spacers 501 are formed by patterning recesses using a wet etch with an etchant selective to the material of the first layers 251 (e.g., silicon germanium (SiGe)) without significantly removing the material of the second layers 261 (e.g., silicon) or the substrate 101 (e.g., Si). For example, in an embodiment in which the first layers 251 are silicon germanium and the second layers 261 are silicon, the wet etch may use an etchant such as hydrochloric acid (HCl).

In an embodiment the wet etching process may be a dip process, a spray process, a spin-on process, or the like. Additionally, the wet etching process may be performed at a temperature of between about 400° C. and about 600° C. and may be continued for a time of between about wo seconds and about 1000 seconds, such as about 300 seconds. However, any suitable process conditions and parameters may be utilized. The etching process may be continued such that recesses with facet limited surfaces are formed in each of the first layers 251 to a length of between about 4 nm and about 8 nm, such as about 6 nm. However, any suitable length may be used.

However, a wet etching process is not the only process that may be utilized. For example, in another embodiment the patterning of the first layers 251 may be performed with an isotropic dry etching process or a combination of a dry etching process and a wet etching process. Any suitable process of patterning the first layers 251 may be utilized, and all such processes are fully intended to be included within the scope of the embodiments.

Once the recesses are formed in each of the first layers 251 in the first device region 106, a spacer material is formed over both the first device region 106. In some embodiments, the spacer material can be different from the material of the gate spacers 131 and can be a dielectric material comprising silicon such as silicon oxide ($SiO_2$), silicon oxynitride (SiON), silicon nitride ($Si_3N_4$), silicon oxycarbide (SiOC), silicon oxycarbonitride (SiOCN), although any suitable material such as low-k materials with a k-value less than about 4.0, or even an air gap, or combination thereof may also be utilized. The spacer material may be deposited using a deposition process such as chemical vapor deposition, physical vapor deposition, or atomic layer deposition to a thickness of between about 3 nm and about 10 nm, such as about 5 nm. However, any suitable thickness or deposition process may be utilized.

By depositing the spacer material over the first device region 106, the spacer material will line the sidewalls of the trenches 133 and will also fill in the recesses in the first layers 251 of the first device region 106. Once the recesses have been filled with the spacer material, a removal process is then performed to remove the excess spacer material from the trenches 133 within the first device region 106, while leaving behind first inner spacers 501 in the first device region 106. In an embodiment, the removal of the excess spacer material may be performed using an etching process such as, e.g., an anisotropic, dry etching process such as a reactive ion etching process. However, any suitable etching process, which removes the excess spacer material from the trenches 133 while leaving behind the first inner spacers 501 and the other inner spacers, may be utilized.

As such, the first inner spacers 501 will take on the shape of the first recesses. Additionally, while an embodiment forming the first inner spacers 501 to faceted shapes is described, this is intended to be illustrative and is not intended to be limited. Rather, any suitable shape, such as a concave shape or a convex shape, or even recesses formed in the first inner spacers 501 may be utilized. All such shapes are fully intended to be included within the scope of the embodiments.

Figure 8:
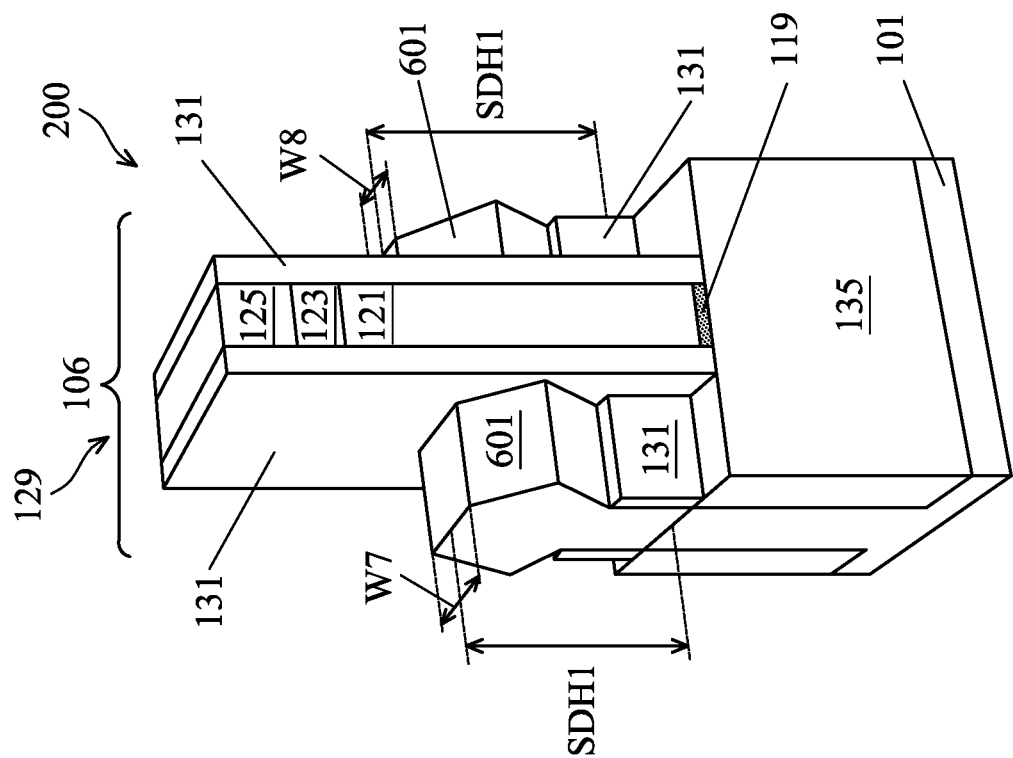

FIG. 8 illustrates formation of source/drain regions 601 within the first device region 106. Based on the different widths (e.g., the first width W1, the second width W2, the third width W3, the fourth width W4, the fifth width W5, and the sixth width W6) of the left side and right side of the active region 301, the source/drain regions 601 are formed with unbalanced widths. For example, according to some embodiments, the source/drain regions 601 located on the left side of the dummy gate stack 129 is formed to a seventh width W7 and the source/drain region 601 located on the right side of the dummy gate stack 129 is formed to an eighth width W8, where W7 is greater than W8. According to some embodiments, the source/drain regions 601 located on the left side of the dummy gate stack 129 are formed to the seventh width W7 of between about 8 nm and about 50 nm, such as about 30 nm and the source/drain region 601 located on the right side of the dummy gate stack 129 is formed to the eighth width W8 of between about 8 nm and about 50 nm, such as about 10 nm.

In an embodiment the source/drain regions 601 may be formed by initially protecting the other device regions with, for example, a photoresist or other masking materials. Once the other device regions have been protected, the source/drain regions 601 may be formed using a growth process such as a selective epitaxial process with a semiconductor material suitable for the device desired to be formed. For example, in an embodiment in which the source/drain regions 6oi are utilized to form an NMOS device, the source/drain regions 6oi may be a semiconductor material such as silicon, silicon phosphorous, silicon carbon phosphorous, combinations, of these, or the like. The epitaxial growth process may use precursors such as silane, dichlorosilane, germane, and the like, and may continue for between about 5 minutes and about 120 minutes, such as about 30 minutes. According to some embodiments, the source/drain regions 601 are formed to a first source/drain height SDH1 of between about 30 nm and about 90 nm, such as about 60 nm. However, any suitable heights and/or suitable depths may be used.

Once the source/drain regions 601 are formed, dopants may be implanted into the source/drain regions 601 by implanting appropriate dopants to complement the dopants within the remainder of the first device region 106. For example, n-type dopants such as phosphorous (P), carbon (C), arsenic (As), silicon (Si), antimony (Sb), or the like, and combinations thereof (e.g., SiP, SiC, SiPC, SiAs, Si, Sb, etc.) may be implanted to form NMOS devices. These dopants may be implanted using the dummy gate stack 129 and the gate spacers 131 as masks.

In another embodiment, the dopants of the source/drain regions 601 may be placed during the growth of the source/drain regions 601. For example, phosphorous may be placed in situ as the source/drain regions 601 are being formed. Any suitable process for placing the dopants within the source/drain regions 601 may be utilized, and all such processes are fully intended to be included within the scope of the embodiments. Furthermore, an anneal process may be performed to activate the dopants within the source/drain regions 601.

Figure 9:
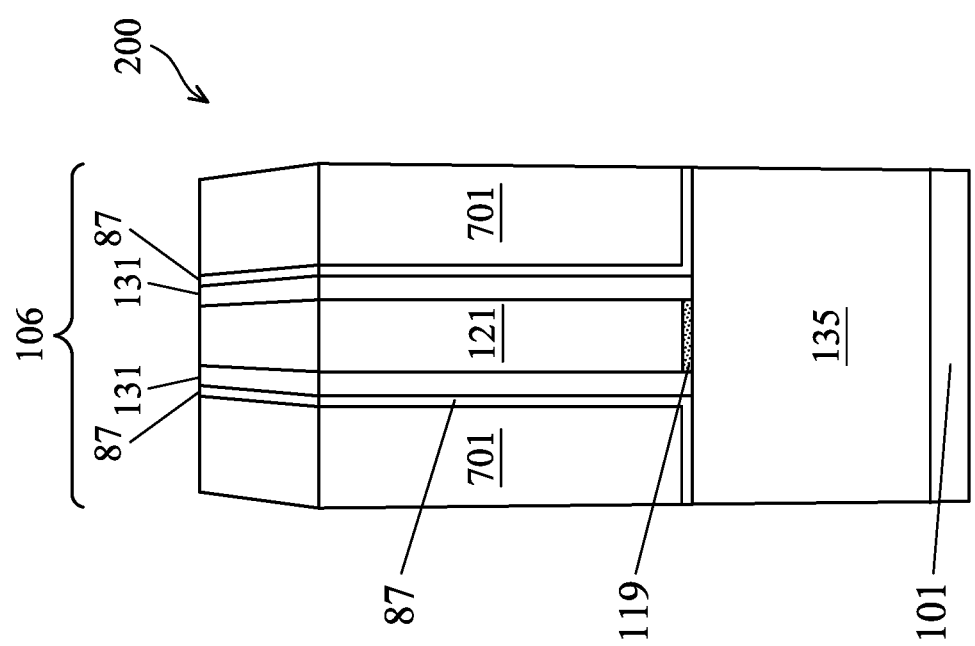

In FIG. 9, a contact etch stop layer (CESL) 87 is deposited over the structure illustrated in FIG. 8. The CESL 87 may comprise a dielectric material with silicon, nitride, and an additional element, such as carbon also added to the material, such as silicon carbon nitride (SiCN). In some embodiments the CESL 87 comprises a dielectric material, such as silicon oxide, silicon nitride or any other suitable dielectric material, or the like. However, any suitable materials may be utilized.

The dielectric material of the CESL 87 (e.g., SiCN) may be conformally deposited over the source/drain regions 601, the fourth hard mask 125, and the gate spacers 131 of the structure shown in FIG. 8. According to some embodiments, the CESL 87 may be formed using a chemical vapor deposition (CVD) process, although any suitable deposition process may be utilized.

FIG. 9 further illustrates an interlayer dielectric (ILD) 701 that is deposited over the CESL 87. The ILD 701 may be formed of a dielectric material, and may be deposited by any suitable method, such as CVD, plasma-enhanced CVD (PECVD), or flowable chemical vapor deposition (FCVD). Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

FIG. 9 further illustrates that a planarization process, such as a CMP, may be performed to level the top surface of the ILD 701 with the top surfaces of the dummy gate electrode 121, the gate spacers 131, and the CESL 87. As such, the planarization process also removes the third hard mask 123 and the fourth hard mask 125 and exposes the top surface of the dummy gate electrode 121 between the gate spacers 131. After the planarization process, top surfaces of the dummy gates 72, the gate spacers 131, and the ILD 701 are level. In some embodiments, the third hard mask 123 (or a portion of the third hard mask 123) may remain over the top surface of the dummy gate electrode 121, in which case the planarization process levels the top surface of the ILD 701, the gate spacers 131, and the CESL 87 with the top surface of the third hard mask 123.

Figure 10:
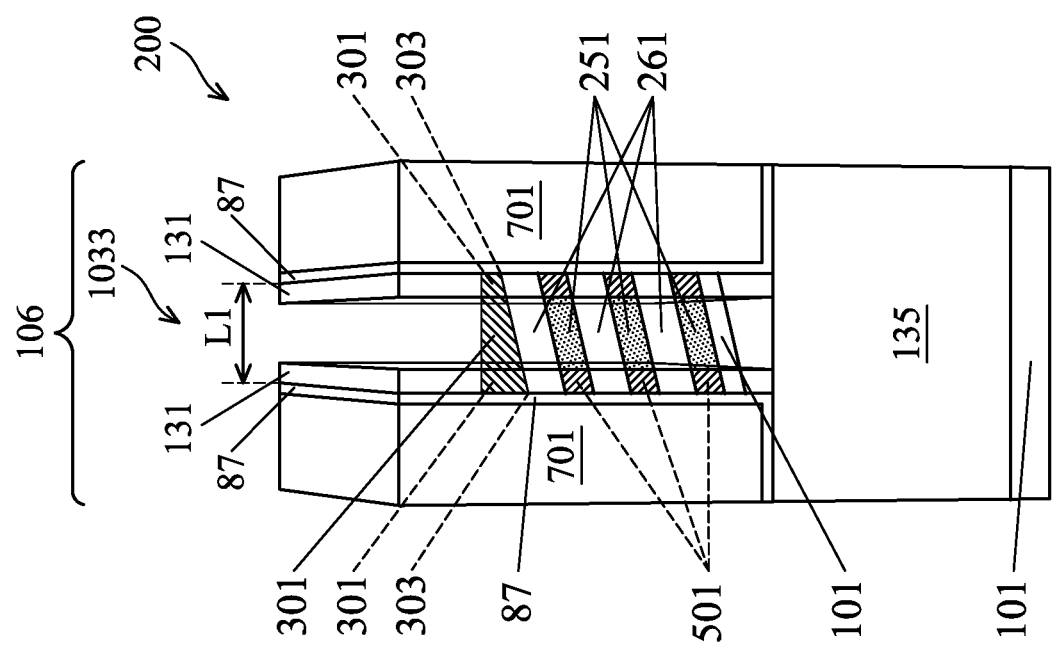

FIG. 10 illustrates a removal of the dummy gate electrode 121, the dummy gate dielectric 119 and (if remaining) removal of any remaining portion of the third hard mask 123. As such, a central portion of the active region 301 is exposed in an opening 1033 between the gate spacers 131, whereas other portions of the active region 301 and the corners 303 of the "L-shape" in the fin 122 remain covered by the gate spacers 131. FIG. 10 further illustrates the gate spacers 131 in phantom to show distal ends of the second layers 261 and the first inner spacers 501 being embedded in the gate spacers 131 and to show the first inner spacers 501 separating the distal ends of the second layers 261 from one another.

In an embodiment any remaining portion of the third hard mask 123 may be removed using an etching process or a planarization process (e.g., a continuation of the previous chemical mechanical polishing process) to remove the material of the third hard mask 123. However, any suitable method of removing the third hard mask 123 may be utilized. Once the hard mask 123 has been removed, the dummy gate electrode 121 is exposed and can then be removed. In an embodiment the dummy gate electrode 121 may be removed using, e.g., one or more wet or dry etching processes that utilize etchants that are selective to the material of the dummy gate electrode 121. However, any suitable removal process may be utilized. Once the dummy gate electrode 121 has been removed, the dummy gate dielectric 119 is exposed and can also be removed. In an embodiment, the dummy gate dielectric 119 is removed using, e.g., one or more wet or dry etching processes that utilize etchants that are selective to the material of the dummy gate dielectric 119. As such, upper surfaces of the STI region 135, an upper surface of a topmost layer of the second layers 261, sides of the first layers 251, sides of the second layers 261, sides of the substrate 101 (above the STI region 135) and sidewalls of the gate spacers 131 are exposed in the central portion of the active region 301.

Figure 11:
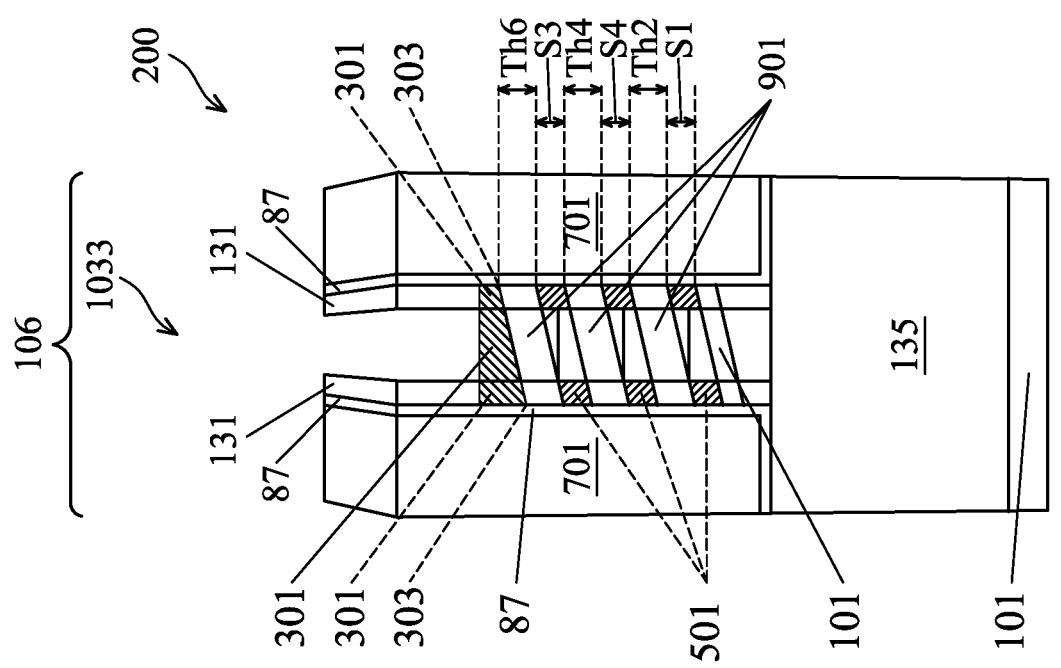

FIG. 11 illustrates a wire release process step. The wire release process step may also be referred to as a sheet release process step, a sheet formation process step, a nanosheet formation process step or a wire formation process step. Once the dummy gate dielectric 119 has been removed (which also exposes the sides of the first layers 251), the first layers 251 may be removed from between the substrate 101 and from between the second layers 261 within both the first device region 106. In an embodiment the first layers 251 may be removed using a wet etching process that selectively removes the material of the first layers 251 (e.g., silicon germanium (SiGe)) without substantively removing the material of the substrate 101 and the material of the second layers 261 (e.g., silicon (Si)). However, any suitable removal process may be utilized. In an embodiment, the etchant may be a high temperature HCl.

Additionally, the wet etching process may be performed at a temperature of between about 400° C. and about 600° C., such as about 560° C., and for a time of between about 100 seconds and about 600 seconds, such as about 300 seconds. However, any suitable etchant, process parameters, and time can be utilized.

By removing the material of the first layers 251, the material of the second layers 261 (e.g., nanosheets) are formed into nanostructures 901 within the first device region 106 separated from each other by the first inner spacers 501. The nanostructures 901 stretch between opposite ones of the source/drain regions 601 (shown in FIG. 8) and collectively form a stack of channel regions of the gate all-around (GAA) transistor being formed within the first device region 106. In an embodiment, the nanostructures 901 are formed to have same thicknesses as the original thicknesses of the second layers 261.

In other embodiments, however, the etching process may also be utilized to reduce a thickness of a portion of the nanostructures 901 such that the thickness of the nanostructures 901 may be different as the width changes. In particular, the thicknesses for the nanostructures 901 may be thinner than the original thicknesses of the second layers 261 (e.g., Si) by about 0.3 nm and about 2 nm. For example, during the wire release process step and during the formation of the gate dielectric 1101, the thicknesses of each of the second layers 261 may experience some Si material loss and/or oxidation. As such, each of the nanostructures 901 and, hence the central portion of the active region 301, are formed to a thickness of between about 4 nm and about 8 nm, such as about 5 nm and are spaced apart by their original spacing (e.g., Th1, Th2, and Th3) plus any additional space (e.g., about 0.3 nm and about 2 nm) created by Si material loss and/or oxidation during the wire release process step and during the formation of the gate dielectric 1101. However, the corners 303 of the "L-shape" in the fin 122 and the other portions of the active region 301 remain protected by the gate spacers 131 during the wire release step and during the formation of the gate dielectric 1101. Accordingly, the corners 303 of the "L-shape" in the fin 122 and the other portions of the active region 301 protected by the gate spacers 131 retain their original thicknesses.

Additionally, although FIG. 11 illustrates the formation of three of the nanostructures 901, any suitable number of the nanostructures 901 may be formed from the nanosheets provided in the multi-layer stack 203. For example, the multi-layer stack 203 (shown in FIG. 1) may be formed to include any suitable number of first layers 251 (e.g., first nanosheets) and any suitable number of second layers 261 (e.g., second nanosheets). As such, a multi-layer stack 203 that comprises fewer first layers 251 and fewer second layers 261, after removal of the first layers 251, forms one or two of the nanostructures 901 as the stack of channel regions of the GAA transistor being formed within the first device region 106. Whereas, a multi-layer stack 203 that comprises many of the first layers 251 and many of the second layers 261, after removal of the first layers 251, forms four or more of the nanostructures 901 as the stack of channel regions of the GAA transistor being formed within the first device region 106. FIG. 11 further illustrates the central region of the active region 301 being exposed while the other portions of the active region 301 and the corners 303 of the "L-shape" in the fin 122 remain protected by the gate spacers 131.

Figure 12:
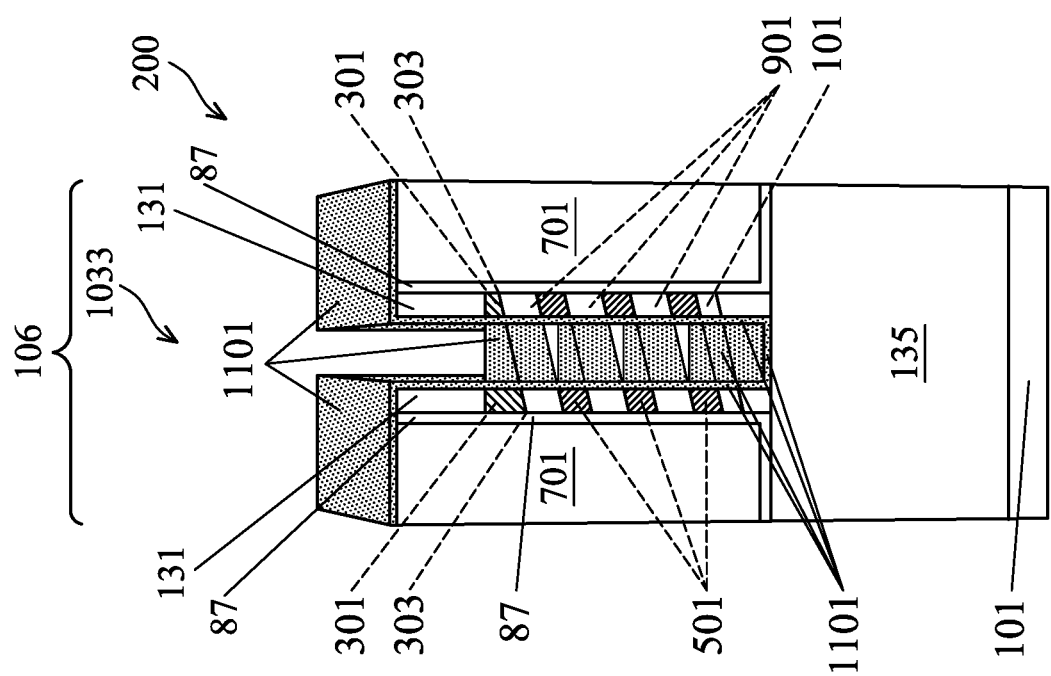

FIG. 12 illustrates the formation of a gate dielectric 1101 within the first device region 106, in accordance with some embodiments. Once the wire release process step has been formed and the nanostructures 901 have been exposed, the gate dielectric 1101 may be formed around the nanostructures 901. In some embodiments, prior to the formation of the gate dielectric 1101, an optional first interface layer (not separately illustrated) may be formed to surround the exposed surfaces of the nanostructures 901, the substrate 101, the STI region 135 and the gate spacers 131 within the opening 1033 between the gate spacers 131 and cover the top surfaces of the gate spacers 131, the CESL 87, and the ILD 701. In some embodiments, the optional first interface layer comprises a buffer material such as silicon oxide ($SiO_x$), although any suitable material may be utilized. The optional first interface layer may be formed around the nanostructures 901 in the first device region 106 using a process such as CVD, PVD, or even oxidation to a thickness of between about 1 Å and about 20 Å, such as about 9 Å. However, any suitable process or thicknesses may be utilized.

In an embodiment the gate dielectric 1101 is a high-k dielectric material such as $HfO_2$, HfSiO, HfSiON, HfTaO, HfTiO, HfZrO, LaO, ZrO, TiO, $Ta_2O_5$, $Al_2O_3$, combinations of these, or the like, deposited through a process such as atomic layer deposition, chemical vapor deposition, or the like. The gate dielectric 1101 may be deposited to a thickness of between about 1 nm and about 3 nm, although any suitable material and thickness may be utilized. As illustrated, the gate dielectric 1101 wraps around the nanostructures 901, thus isolating the stack of channel regions of the GAA transistor being formed within the first device region 106. In some embodiments, an optional nitrogen doped dielectric material (not illustrated) may be initially formed prior to forming the metal content material of a gate electrode over the gate dielectric 1101, as is described in greater detail below.

Figure 13A:
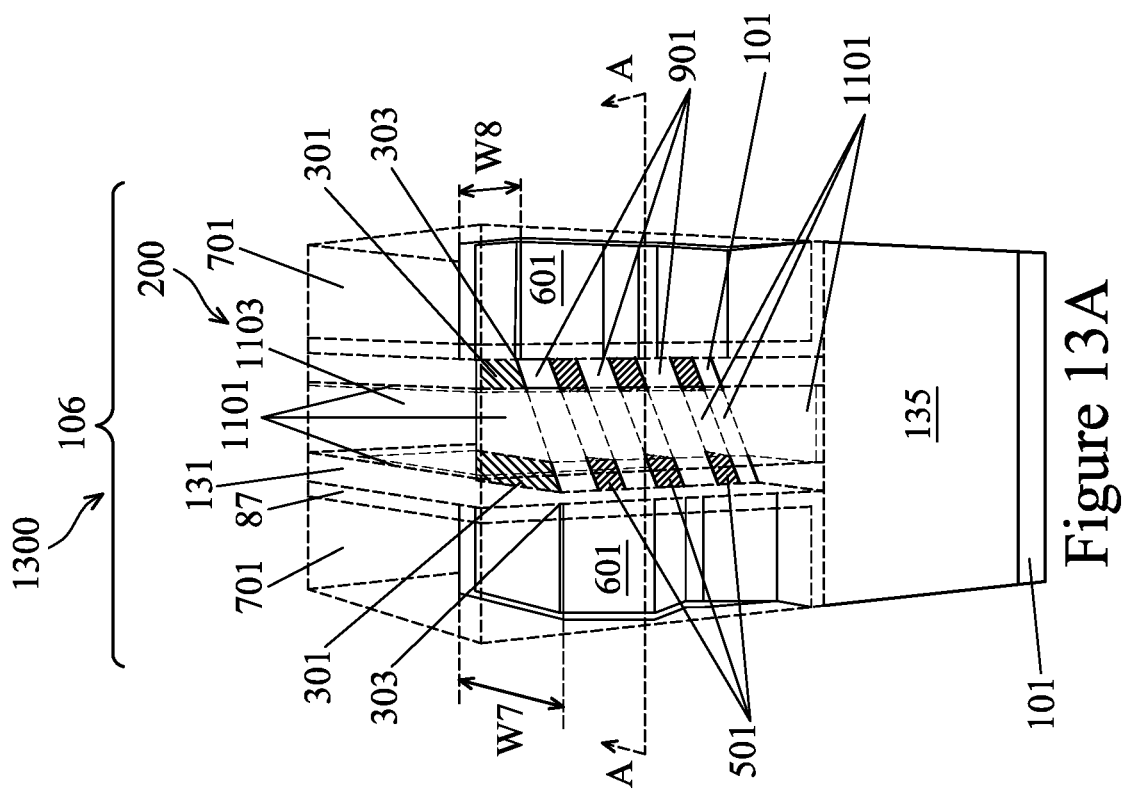
FIG. 13A illustrates a perspective view of the GAA device, in accordance with an embodiment.

FIG. 13A illustrates the formation of a gate electrode 1103 for an "L-shaped" GAA transistor 1300 formed within the first device region 106, in accordance with some embodiments. The gate electrode 1103, the gate spacers 131, the CESL 87, and the ILD 701 are illustrated in FIG. 13A using a phantom view to allow certain features embedded within the "L-shaped" GAA transistor 1300 to be seen. For example, the portions of the active region 301, the source/drain regions 601, portions of the nanostructures 901, the first inner spacers 501, and the gate dielectric 1101 that are embedded in the gate electrode 1103, the gate spacers 131, the CESL 87, and the ILD 701 may be viewed in the "L-shaped" GAA transistor 1300 illustrated in FIG. 13A. FIG. 13A further illustrates the seventh width W7 of the source/drain region 601 on the left side of the "L-shaped" GAA transistor 1300 and the eighth width W8 of the source/drain region 601 on the right side of the "L-shaped" GAA transistor 1300.

Once the gate dielectric 1101 has been formed around the nanostructures 901, the gate electrode 1103 may be formed over the gate dielectric 1101 and filling in the remaining space of the opening 1033 between the gate spacers 131. In an embodiment the gate electrode 1103 is formed using multiple layers, each layer deposited sequentially adjacent to each other using a highly conformal deposition process such as atomic layer deposition, although any suitable deposition process may be utilized. As such, the multiple layers used to form the gate electrode 1103 fill the open areas remaining between the stack of channel regions isolated by the gate dielectric 1101 and fill other open areas remaining in the opening 1033. According to some embodiments, the gate electrode 1103 may comprise a capping layer, a barrier layer, an n-metal work function layer, a p-metal work function layer, and a fill material (not separately illustrated).

The capping layer may be formed adjacent to the gate dielectric 1101 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as atomic layer deposition, chemical vapor deposition, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

According to some embodiments, the GAA transistor being formed within the first device region 106 may be a first type of GAA transistor (e.g., NMOS). As such, the n-metal work function layer may be formed adjacent to the barrier layer. In an embodiment the n-metal work function layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the first n-metal work function layer may be deposited utilizing an atomic layer deposition (ALD) process, CVD process, or the like. However, any suitable materials and processes may be utilized to form the n-metal work function layer.

The p-metal work function layer may be formed adjacent to the n-metal work function layer. In an embodiment, the first p-metal work function layer may be formed from a metallic material such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, TaN, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-metal work function layer may be deposited using a deposition process such as atomic layer deposition, chemical vapor deposition, or the like, although any suitable deposition process may be used.

Once the p-metal work function layer has been formed, the fill material is deposited to fill the remainder of the opening 1033. In an embodiment the fill material may be a material such as tungsten, Al, Cu, AlCu, W, Ti, TiAlN, TiAl, Pt, TaC, TaCN, TaSiN, Mn, Zr, TiN, Ta, TaN, Co, Ni, combinations of these, or the like, and may be formed using a deposition process such as chemical vapor deposition, atomic layer deposition, physical vapor deposition, plating, combinations of these, or the like. However, any suitable material may be utilized.

Once the openings 1033 left behind by the removal of the dummy gate electrode 121 have been filled, the materials of the gate electrode 1103 in the first device region 106 may be planarized in order to remove any material that is outside of the openings left behind by the removal of the dummy gate electrodes 121. In a particular embodiment the removal may be performed using a planarization process such as chemical mechanical polishing. However, any suitable planarization and removal process may be utilized.

Figure 13B:
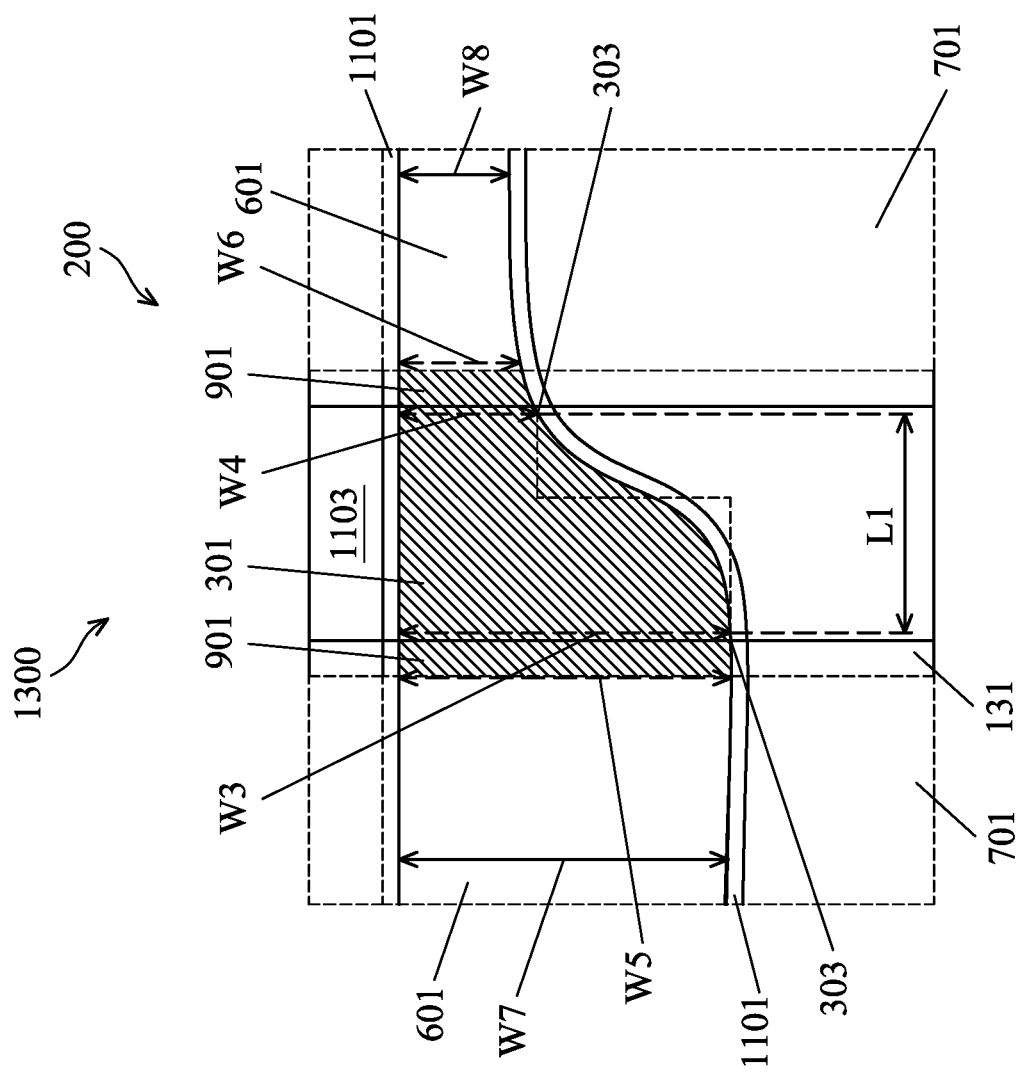
FIG. 13B illustrates a top-down view through a cross section of the GAA device illustrated in FIG. 13A, in accordance with an embodiment.

FIG. 13B illustrates a top-down view through the cut-line A-A of the "L-shaped" GAA transistor 1300 in FIG. 13A, in accordance with an embodiment. In particular, FIG. 13B illustrates the gate electrode 1103, the gate spacers 131, and the active region 301 within the channel region of the "L-shaped" GAA transistor 1300. FIG. 13B further illustrates features of the active region 301 including: the corners 303, the seventh width W7 of the left-side source/drain region 601, the eighth width W8 of the right-side source/drain region 601, and the first length L1, according to some embodiments. For ease of discussion, the gate dielectric 1101 and the CESL 87 are not shown.

With further regard to FIG. 13B, this figure also illustrates that the "L-shaped" GAA transistor 1300 is formed, according to some embodiments, with the gate electrode 1103 disposed directly over and aligned with the "L-shaped" active region 301 such that the corners 303 of the "L-shape" in the fin 122 are disposed beneath the gate electrode 1103 at the interfaces between the stack of the nanostructures 901 and the source/drain regions 601. Furthermore, FIG. 13B illustrates that the interface at the left side of the active region 301 (e.g., left-side channel width) has the third width W3 and the interface at the right side of the active region 301 (e.g., right-side channel width) has the fourth width W4, wherein the third width W3 is greater than the fourth width W4. FIG. 13B further illustrates a left-side channel interface between the left side distal ends of the nanostructures 901 and the source/drain region 601 having, e.g., the fifth width W5 and a right-side channel interface between the right side distal ends of the nanostructures 901 and the source/drain region 601 having, e.g., the sixth width W6.

Such multi-layer active devices 200 comprising the "L-shaped" active region with a width of one side of the active region 301 being greater than a width of the other side of the active region 301 may provide a power savings benefit as compared to an active device 200 having an active region 301 with no difference between widths of the one side and the other. For example, the "L-shaped" GAA transistor 1300 may be formed with the active region 301 having the left-side channel width being greater than the right-side channel width (e.g., W3>W4) may provide a power saving benefit of between about 6% and about 8%. Furthermore, multi-layer active devices 200 comprising the "L-shaped" active region 301 may be formed with channel interfaces to about the same width of the channel widths of the active region 301 (e.g., W5-W3 and/or W6-W4). As such, the source/drain regions 601 may be formed with little to no distortion at their interfaces with the stack of nanostructures 901 in the active region 301.

Figure 14A:
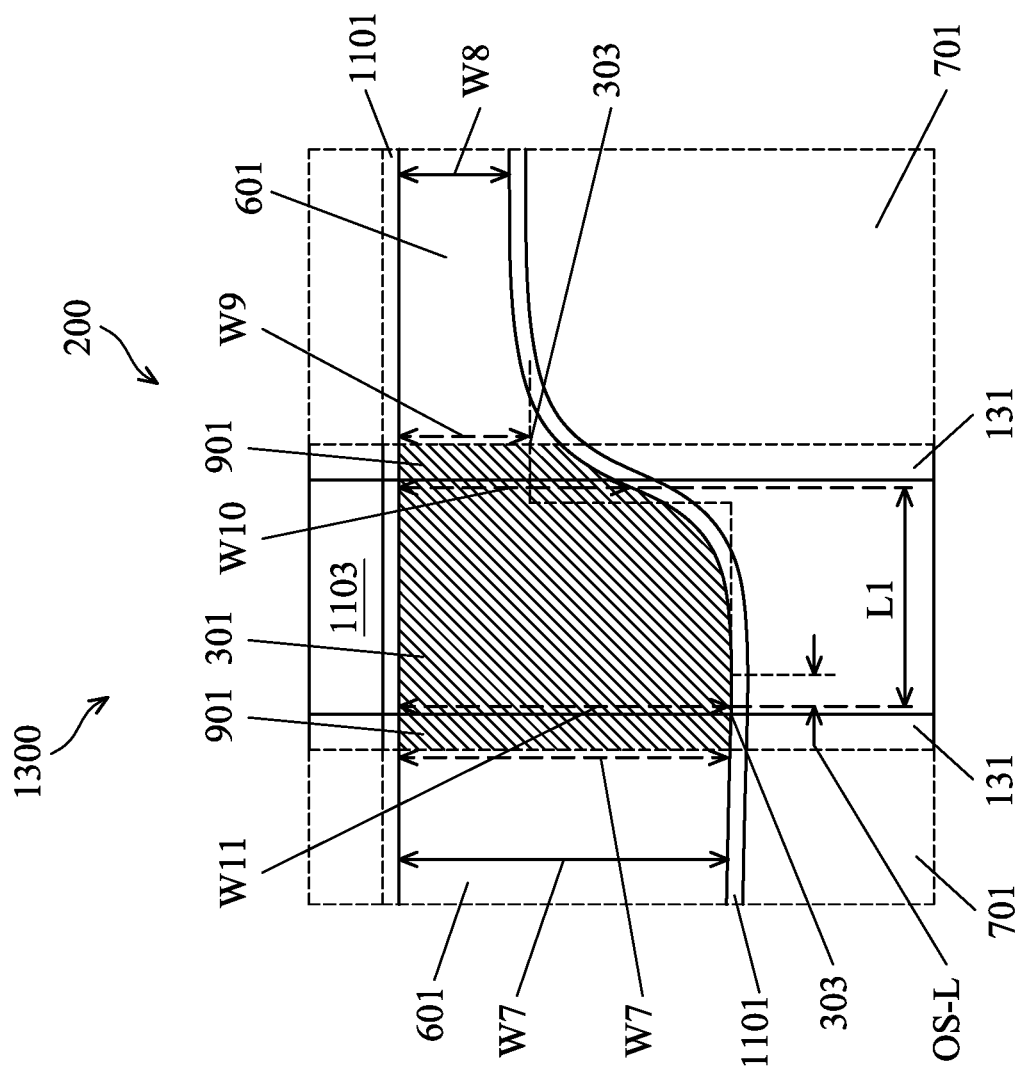
FIGS. 14A and 14B illustrate top-down views through cross sections of the GAA device, in accordance with other embodiments.

FIG. 14A illustrates a top-down view through the cut-line A-A of the "L-shaped" GAA transistor 1300 in FIG. 13A, in accordance with another embodiment. FIG. 14A is similar to and illustrates the same features as FIG. 13B; however, in FIG. 14A the gate electrode 1103, gate dielectric 1101 (not shown), and gate spacers 131 are formed over the active region 301 with an offset to the left (OS-L), according to some embodiments. For ease of discussion, the gate dielectric 1101 and the CESL 87 are not shown.

According to some embodiments, the offset to the left (OS-L) is between about 0 nm and about 8 nm and may be formed by shifting the design of the photoresist masks or else through the use of measured overlay shifts. The left-side channel width and the right side-channel width of the active region 301 appear shifted to the left of the corners 303 of the "L-shape" in the fin 122 by the distance of the offset to the left (OS-L) with respect to each of the corners 303. As such, the corner 303 on the left side of the multi-layer active device 200 is located beneath the gate electrode 1103 and the corner 303 on the right side of the multi-layer active device 200 is located beneath the gate spacer 131 to the right of the right side of the active region 301.

As such, the interface between the active region 301 and the epitaxial growth of the source/drain regions 601 at the right side of the multi-layer active device 200 may have a ninth width W9 of between about 8 nm and about 50 nm, such as about 10 nm, while the interface between the gate electrode 1103 and the right side of the active region 301 may have a tenth width W10 of between about 8 nm and about 50 nm, such as about 12 nm. Similarly, on an opposite side of the active region 301, the interface between the active region 301 and the epitaxial growth of the source/ drain regions 601 a the left side of the multi-layer active device 200 may have an the seventh width W7, while the interface between the gate electrode 1103 and the left side of the active region 301 may have an eleventh width W11 of between about 8 nm and about 50, such as about 30 nm. However, any suitable dimensions may be utilized.

Figure 14B:
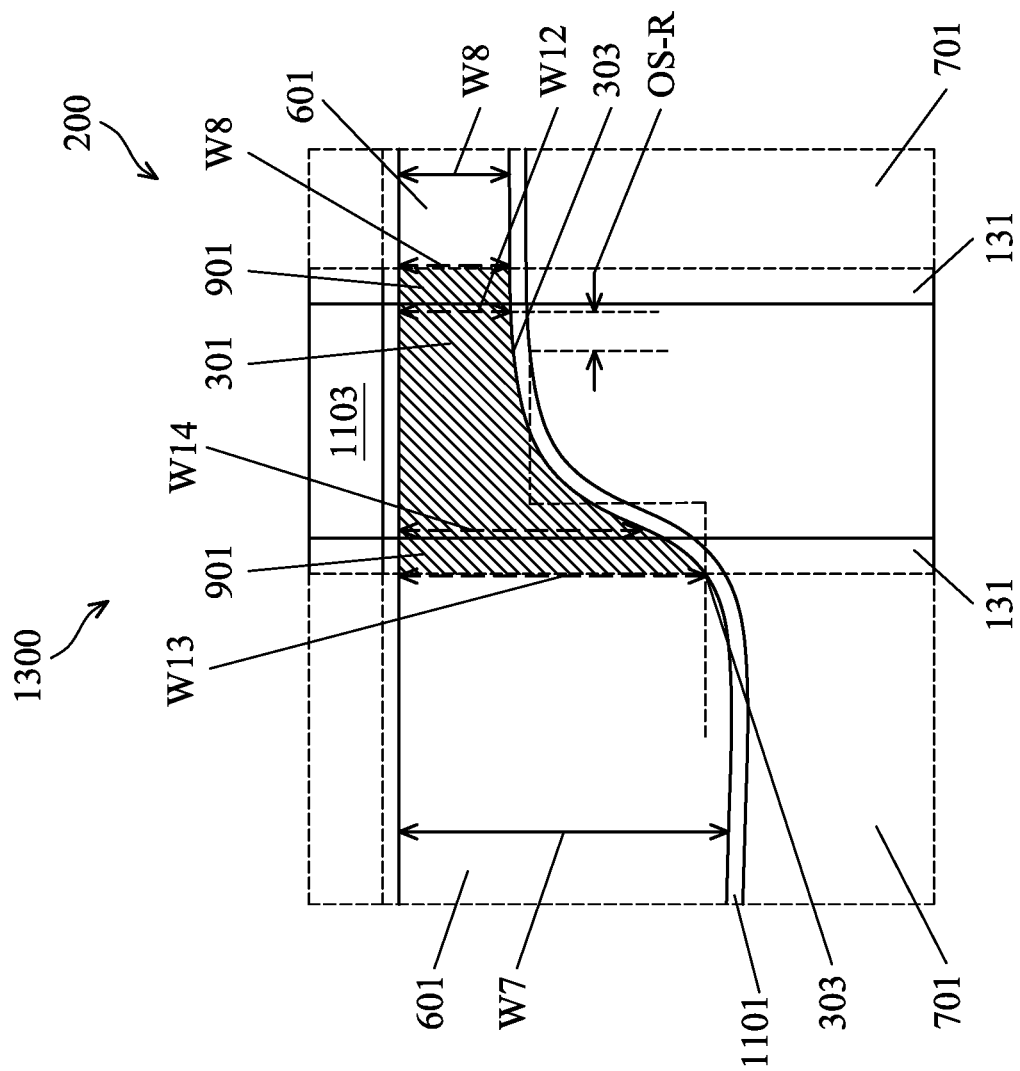

FIG. 14B illustrates a top-down view of a cross-section through the cut-line A-A of the "L-shaped" GAA transistor 1300 in FIG. 13A, in accordance with another embodiment. FIG. 14A is similar to and illustrates the same features as FIG. 13B; however, in FIG. 14B the gate electrode 1103, gate dielectric 1101 (not shown), and gate spacers 131 are formed over the active region 301 with an offset to the right (OS-R), according to some embodiments. For ease of discussion, the gate dielectric 1101 and the CESL 87 are not shown.

According to some embodiments, the offset to the right (OS-R) is between about 0 nm and about 8 nm and may be formed by shifting the design of the photoresist masks or else through the use of measured overlay shifts. The left channel width and the right channel width of the active region 301 appear shifted to the right of the corners 303 of the "L-shape" in the fin 122 by the distance of the offset to the right (OS-R). As such, the corner 303 on the left side of the multi-layer active device 200 is located beneath the gate spacer 131 or the ILD 701 to the left of the active region 301 and the corner 303 on the right side of the multi-layer active device 200 is located beneath the gate electrode 1103 to the left of the gate spacer 131 on the right side of the gate electrode 1103.

As such, the interface between the active region 301 and the epitaxial growth of the source/drain regions 601 at the right side of the multi-layer active device 200 may have the eighth width W8 of between about 8 nm and about 50 nm, such as about 10 nm, while the interface between the gate electrode 1103 and the right side of the active region 301 may have a twelfth width W12 of between about 8 nm and about 50 nm, such as about 12 nm. Similarly, on an opposite side of the active region 301, the interface between the active region 301 and the epitaxial growth of the source/drain regions 601 at the left side of the multi-layer active device 200 may have a thirteenth width W13, while the interface between the gate electrode 1103 and the left side of the active region 301 may have a fourteenth width W14 of between about 8 nm and about 50 nm, such as about 28 nm. However, any suitable dimensions may be utilized.

FIGS. 15A-15E illustrates several cell schemes comprising arrays of multi-layer active devices, according to some embodiments. Each of the cell schemes comprises an array of multi-layer active devices 1501 incorporating one or more of the "L-shaped" GAA transistors 1300. The flexible design and power benefits of the "L-shaped" GAA transistors 1300 may be applied to a large variety of cell schemes allowing for further design flexibility and power savings to be built into different cell schemes.

Figure 15A:
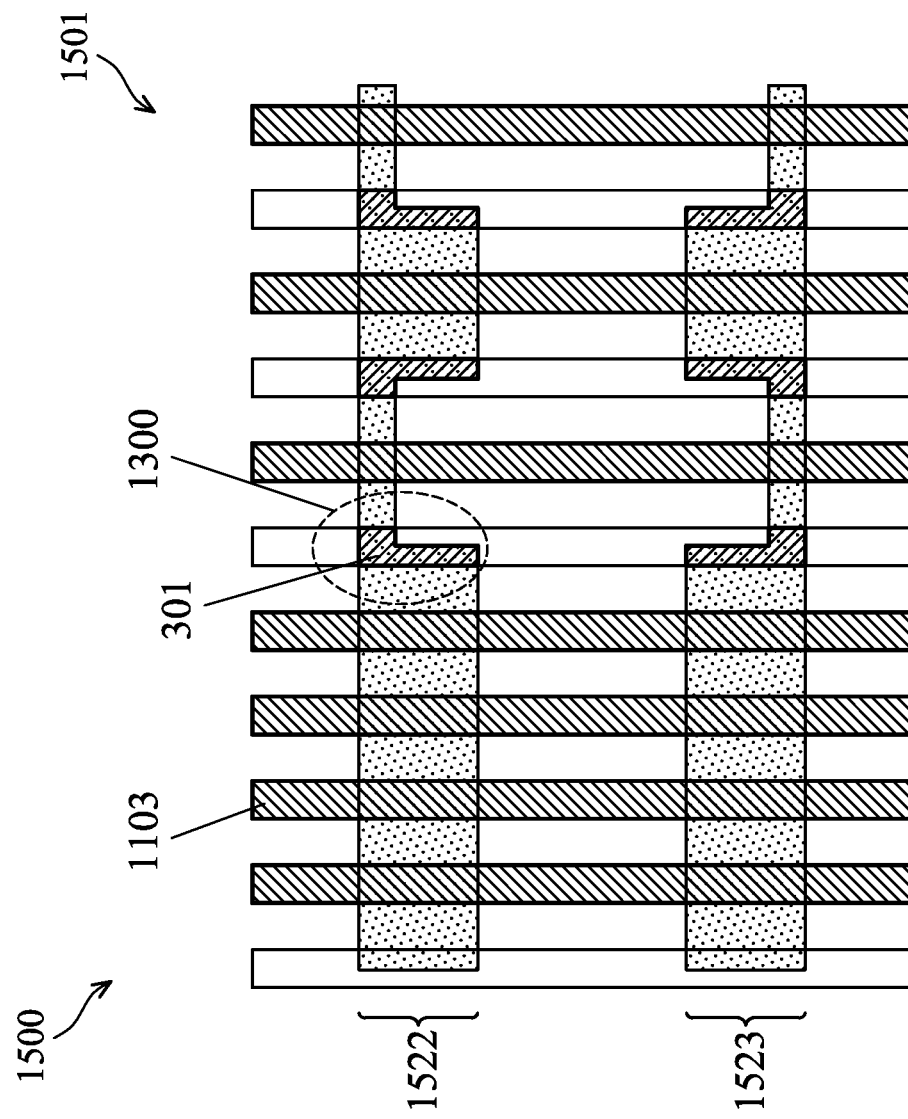
FIGS. 15A, 15B, 15C, 15D, and 15E illustrate top-down views of several cell schemes comprising arrays of multi-layer active devices, according to some embodiments.

Referring to FIG. 15A, this figure illustrates a first cell scheme 1500 formed using six of the "L-shaped" GAA transistors 1300, according to some embodiments. The first cell scheme 1500 comprises a first fin 1522 having a first complex shape including three "L-shaped" active regions 301 and a second fin 1523 having a second complex shape including three "L-shaped" active regions 301, the second complex shape may be a mirror image of the first complex shape, according to some embodiments. The first fin 1522 and the second fin 1523 may be formed in the multi-layered stack 203 (not shown) and substrate 100 (not shown) using the materials and processes used to form the fin 122, as set forth above. Additionally, if desired one or more of the gate electrodes 1103 may be replaced with a dummy electrode, including one or more of the gate electrodes 1103 that overlie the "L-shaped" active regions 301.

Figure 15B:
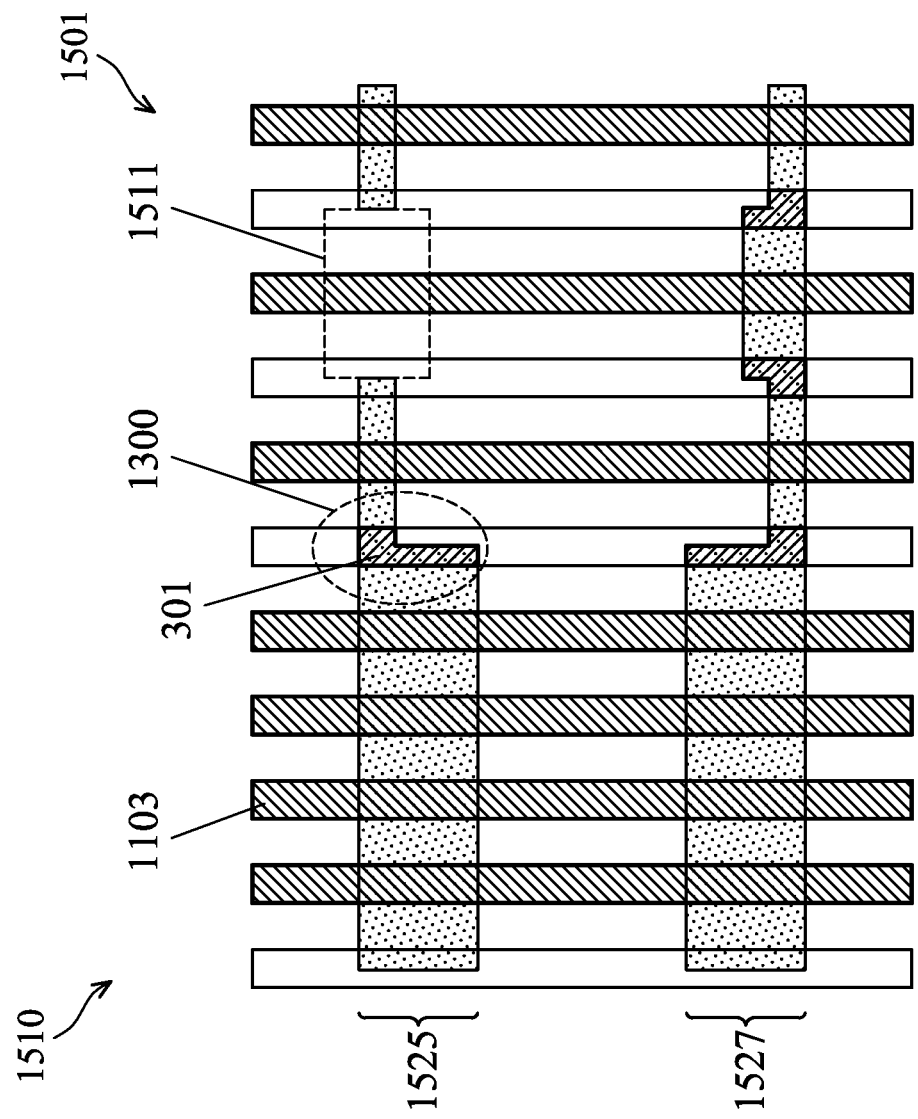

FIG. 15B illustrates a second cell scheme 1510 formed using four of the "L-shaped" GAA transistors 1300, according to some embodiments. The second cell scheme 1510 comprises a third fin 1525 having a third complex shape including one "L-shaped" active regions 301, the third complex shape including an opening 1511 in the first fin 1522. The second cell scheme 1510 further comprises a fourth fin 1527 having a second complex shape including three "L-shaped" active regions 301. According to an embodiment, a first of the three "L-shaped" active regions 301 of the second fin 1523 may have a same first active width as the one "L-shaped" active region 301 in the first fin 1522. Furthermore, the remaining two of the three "L-shaped" active regions 301 of the fourth fin 1527 may have a same second active width less than the first active width. According to some embodiments, the first active width may be between about 8 nm and about 50 nm, such as about 30 nm and the second active width may be between about 8 nm and about 50 nm, such as about 10 nm. The third fin 1525, the fourth fin 1527, the "L-shaped" active regions 301, and the gate electrodes 1103 may be formed using any of the materials and processes described herein.

Figure 15C:
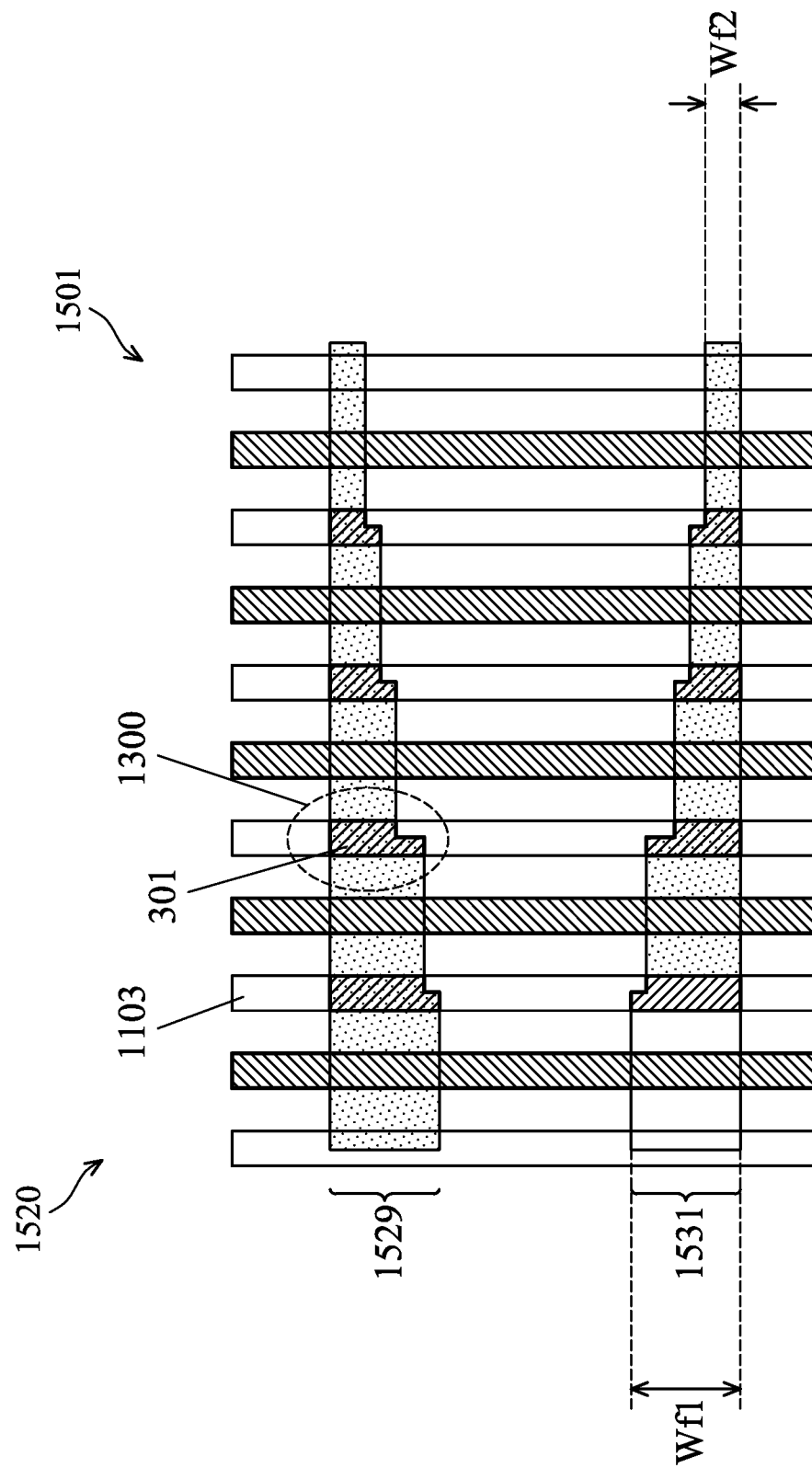

FIG. 15C illustrates a third cell scheme 1520 formed using four of the "L-shaped" GAA transistors 1300, according to some embodiments. The third cell scheme 1520 comprises a fifth fin 1529 having a fifth complex shape including four "L-shaped" active regions 301 and a sixth fin 1531 having a sixth complex shape including four "L-shaped" active regions 301. According to some embodiments, the sixth complex shape may be a mirror image of the fifth complex shape and the four "L-shaped" active regions 301 may have fins widths that are progressively smaller going from the left side of the fins to the right side of the fins. For example, the "L-shaped" active regions 301 may have a first fin width Wf1 of between about 8 nm and about 50 nm, such as about 40 nm and may have a second fin width Wf2 of between about 8 nm and about 50 nm, such as about 10 nm, with the width of the fins decreasing by an interval of between about 72 nm and about 102 nm, such as about 90 nm. The fifth fin 1529, the sixth fin 1531, the "L-shaped" active regions 301, and the gate electrodes 1103 may be formed using any of the materials and processes described herein.

Figure 15D:
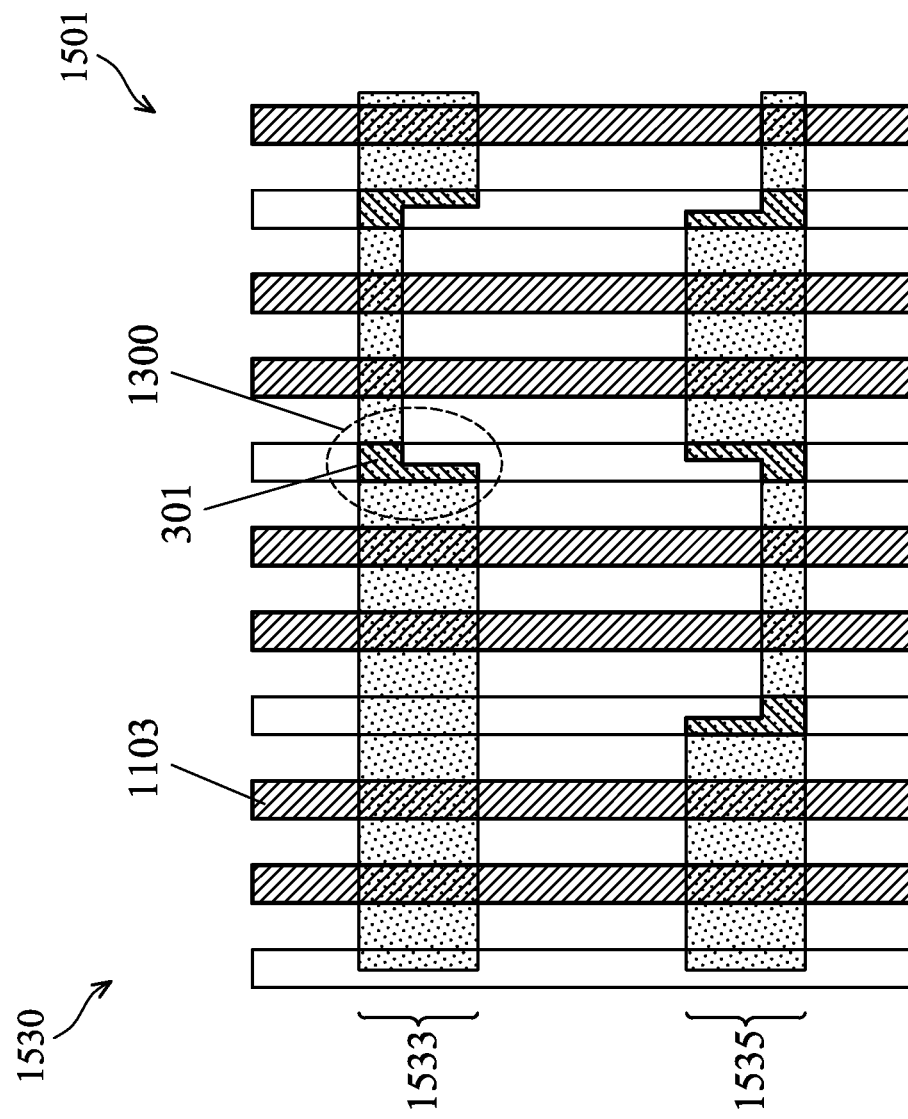

FIG. 15D illustrates a fourth cell scheme 1530 formed using five of the "L-shaped" GAA transistors 1300, according to some embodiments. The fourth cell scheme 1530 comprises a seventh fin 1533 having a seventh complex shape including two of the "L-shaped" active regions 301 and an eighth fin 1535 having an eighth complex shape including three of the "L-shaped" active regions 301. In this embodiment the complex shapes may be offset from each other such that the seventh fin 1533 and the eighth fin 1535 are not mirror images of each other. The seventh fin 1533, the eighth fin 1535, the "L-shaped" active regions 301, and the gate electrodes 1103 may be formed using any of the materials and processes described herein.

Figure 15E:
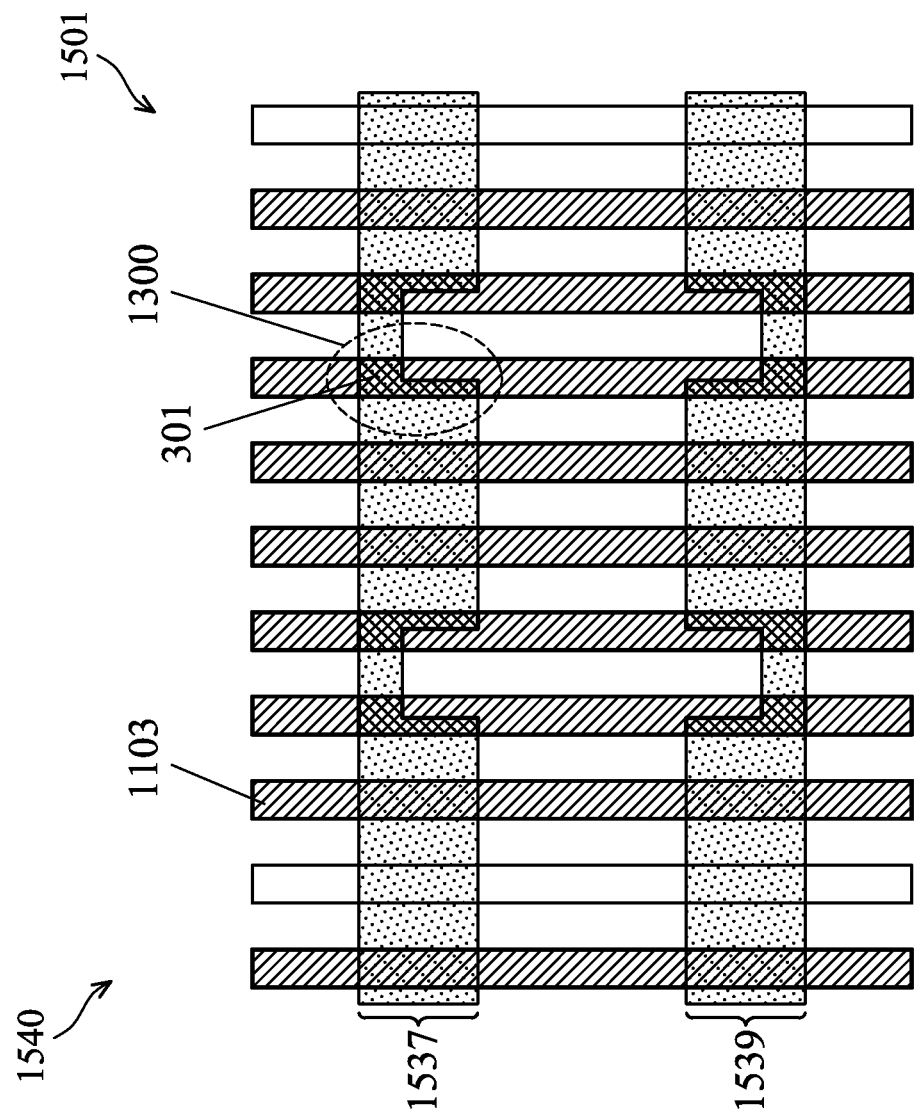

FIG. 15E illustrates a fifth cell scheme 1540 formed using eight of the "L-shaped" GAA transistors 1300, according to some embodiments. The fifth cell scheme 1540 comprises a ninth fin 1537 having a ninth complex shape including four of the "L-shaped" active regions 301 and a tenth fin 1539 having a tenth complex shape including four of the "L-shaped" active regions 301. According to some embodiments, the tenth complex shape may be a mirror image of the ninth complex shape, with adjacent gate electrodes 1103 each overlying an "L-shaped" active region 301. The ninth fin 1537, the tenth fin 1539, the "L-shaped" active regions 301, and the gate electrodes 1103 may be formed using any of the materials and processes described herein.

In each of the embodiments described above, the "L-shaped" GAA transistors 1300 may be formed as either an n-type (NMOS) GAA transistor or else as a p-type (PMOS) GAA transistor. In addition, the embodiments disclosed herein may be applied in both N-FET devices and P-FET devices to "L-shaped" GAA transistors. As such, the embodiments disclosed herein may be used for many power saving applications with highly flexible design options.

Embodiments disclosed herein are directed towards an active device 200 and methods of forming the multi-layer active device 200 comprising complex shaped (e.g., "L-shape") active regions 301 within the nanostructures 901 of the multi-layer active device 200. According to the embodiments, active regions 301 may be formed having nanostructure active lengths L1 between corners 303 of the active regions 301. The corners 303 are disposed under gate spacers 131 of the active device. At distal ends of the active regions 301, the nanostructures 901 are formed with different widths. According to some embodiments, the multi-layer active device 200 may have a power savings benefit of between about 6% to about 8% as compared to an active device 200 with active regions 301 that are not complex shaped. Furthermore, the multi-layer active device 200 provides design flexibility allowing for many different arrangements of the active devices.

By forming and utilizing the nanostructures 901 with "L-shaped" active regions 301 within the nanostructures 901 of the multi-layer active device 200, high performance may be achieved with short channel devices and further power savings may be achieved. Furthermore, flexible designs for different cell types using the different embodiments of the GAA devices with "L-shaped" corners 303 disposed beneath the gate spacers 131 and/or gate electrodes as disclosed herein.

According to an embodiment, a method includes: depositing a first sheet over a semiconductor substrate; depositing a first semiconductor material over the first sheet; depositing a second sheet over the first semiconductor material; depositing a second semiconductor material over the second sheet; patterning the first sheet, the first semiconductor material, the second sheet, and the second semiconductor material into a fin with a first width and a second width, the first width being greater than the second width; removing the first sheet and the second sheet to form a first nanostructure from the first semiconductor material and a second nanostructure from the second semiconductor material; depositing a gate dielectric layer to surround the first nanostructure and the second nanostructure; and depositing a gate electrode around the gate dielectric layer. In an embodiment the depositing the gate electrode comprises forming the gate electrode at least partially over a first corner of the first nanostructure. In an embodiment after the depositing the gate dielectric layer, a gate spacer is adjacent to the gate dielectric layer and at least partially over a second corner of the first nanostructure, the second corner being adjacent to a portion of the fin with the second width. In an embodiment the depositing the gate electrode comprises forming the gate electrode at least partially over a second corner of the first nanostructure. In an embodiment after the depositing the gate dielectric layer, a gate spacer is adjacent to the gate dielectric layer and at least partially over a second corner of the first nanostructure, the second corner being adjacent to a portion of the fin with the first width. In an embodiment the method further includes: epitaxially growing a first source/drain region adjacent the first nanostructure, the first source/drain region having a third width; and epitaxially growing a second source/drain region adjacent the first nanostructure, the second source/drain region having a fourth width different from the third width. In an embodiment the first width is between about 8 nm and about 30 nm According to an embodiment, a method includes: forming a multilayer stack over a semiconductor substrate, the multilayer stack comprising first layers having a first material and second layers having a second material different from the first material; etching a pattern into the multilayer stack, a remainder of the multilayer stack comprising an active region separating a first side of the remainder of the multilayer stack from a second side of the remainder of the multilayer stack, the first side having a first width and the second side having a second width that is different than the first width; performing a wire release process to remove the first layers and form a stack of nanostructures, the stack of nanostructures having the first width at the first side and the second width at the second side; depositing a gate dielectric layer around the stack of nanostructures; and depositing a gate electrode surrounding each nanostructure within the stack of nanostructures. In an embodiment the method further includes forming a first source/drain region adjacent to the stack of nanostructures at the first side and forming a second source/drain region adjacent to the stack of nanostructures at the second side, the first source/drain region having a width that is greater than a width of the second source/drain region. In an embodiment a difference between the first width and the second width is at most 8 nm. In an embodiment one nanostructure within the stack of nanostructures comprises a first corner at the first side and the first corner is located at least partially beneath the gate electrode. In an embodiment the one nanostructure comprises a second corner at the second side and the second corner is located at least partially beneath the gate electrode. In an embodiment the one nanostructure comprises a second corner at the second side and the second corner is located at least partially beneath an interlayer dielectric, wherein the first width is larger than the second width. In an embodiment the one nanostructure comprises a second corner at the second side and the second corner is located at least partially beneath an interlayer dielectric, wherein the first width is smaller than the second width In an embodiment, a device includes: a gate dielectric over a substrate; a gate electrode around the gate dielectric; and a vertical stack of nanostructures, each nanostructure of the vertical stack of nanostructures comprising an active region being surrounded by the gate dielectric, wherein each of the active regions comprises a first channel width on a first side of the gate dielectric and a second channel width on a second side of the gate dielectric, the first channel width being greater than the second channel width. In an embodiment the first channel width is no greater than 16 nm larger than the second channel width. In an embodiment a first nanostructure of the vertical stack of nanostructures comprises a first corner on the first side of the gate dielectric and a second corner on the second side of the gate dielectric. In an embodiment the device further includes: a first gate spacer disposed adjacent the gate electrode on the first side of the gate dielectric; and a second gate spacer disposed adjacent the gate electrode on the second side of the gate dielectric. In an embodiment the first corner is disposed at least partially beneath the first gate spacer and the second corner is disposed at least partially beneath the gate electrode. In an embodiment the first corner is disposed at least partially beneath the gate electrode and the second corner is disposed at least partially beneath the second gate spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a plurality of first layers and a plurality of second layers over a semiconductor substrate, wherein the plurality of first layers alternate with the plurality of second layers, and a material of the plurality of first layers is different from a material of the second plurality of layers;
   patterning the plurality of first layers, the plurality of second layers, and the semiconductor substrate into a fin, the fin comprising:
      a first portion of the fin having a first L-shaped active region in a top-down view; and
      a second portion of the fin having a second L-shaped active region in the top-down view;
   forming a first gate electrode over the first L-shaped active region; and
   forming a second gate electrode over the second L-shaped active region.

2. The method of claim 1, wherein in the top-down view the first L-shaped active region has a first active width and a second active width, wherein the first active width is measured along a direction that is parallel to a direction in which the second active width is measured, and wherein the first active width is larger than the second active width.

3. The method of claim 2, wherein the first active width is in a range from 8 nm to 50 nm.

4. The method of claim 2, wherein in the top-down view the second L-shaped active region has a third active width and a fourth active width, wherein the third active width is measured along a direction that is parallel to a direction in which the first active width, the second active width, and the fourth active width are measured, and wherein the third active width is larger than the fourth active width.

5. The method of claim 4, wherein the first active width and the third active width are equal, and the second active width and the fourth active width are equal.

6. The method of claim 4, wherein the first active width and the third active width are not equal, and the second active width and the fourth active width are not equal.

7. The method of claim 4, wherein the first active width is larger than the second active width, the third active width, and the fourth active width.

8. The method of claim 4, further comprising:
   prior to forming the first gate electrode and forming the second gate electrode, etching the plurality of first layers to form a plurality of nanostructures from the plurality of second layers.

9. A method comprising:
   forming a multilayer stack over a semiconductor substrate, the multilayer stack comprising alternating first layers and second layers, the first layers comprising a first material, the second layers comprising a second material, wherein the first material is different from the second material;
   etching the multilayer stack and the semiconductor substrate to form a fin, wherein a first portion of the fin and a second portion of the fin are disposed on opposite sides of an active region, wherein a ratio of a first width of the first portion of the fin to a second width of the second portion of the fin is in a range between 1.5:1 to 4:1;
   selectively removing the first layers to form a plurality of nanostructures from the second layers; and
   forming a gate electrode around each of the plurality of nanostructures.

10. The method of claim 9, further comprising:
    forming a first source/drain region in the first portion of the fin adjacent to a first end of the active region; and
    forming a second source/drain region in the second portion of the fin adjacent to a second end of the active region, the first source/drain region having a third width that is different than a fourth width of the second source/drain region, wherein the third width is measured in a direction that is parallel to a direction in which the fourth width is measured.

11. The method of claim 10, wherein the third width is larger than the fourth width.

12. The method of claim 10, wherein a first nanostructure of the plurality of nanostructures comprises a first corner adjacent the first source/drain region, the first corner being located at least partially beneath the gate electrode.

13. The method of claim 12, wherein the first nanostructure of the plurality of nanostructures comprises a second corner adjacent the second source/drain region, the second corner being located at least partially beneath an interlayer dielectric.

14. The method of claim 9, wherein a difference between the first width and the second width is at most 10 nm.

15. A structure comprising:
    a first fin having a first complex shape, the first complex shape including a first L-shaped channel region, wherein in the first L-shaped channel region has a first active width and a second active width, wherein the first active width is measured along a direction that is parallel to a direction in which the second active width is measured, and wherein the first active width is larger than the second active width;
    a second fin adjacent to the first fin, the second fin having a second complex shape, the second complex shape including a second L-shaped channel region, wherein the first complex shape is a mirror image of the second complex shape;
    a gate dielectric surrounding each of the first L-shaped channel region and the second L-shaped channel region; and
    a gate electrode over and around each of the first L-shaped channel region and the second L-shaped channel region.

16. The structure of claim 15, wherein in the second L-shaped channel region has a third active width and a fourth active width, wherein the third active width is measured along a direction that is parallel to a direction in which the fourth active width is measured, wherein the third active width is larger than the fourth active width, wherein the first active width is equal to the third active width, and the second active width is equal to the fourth active width.

17. The structure of claim 16, wherein the first fin having the first complex shape further comprises a third L-shaped channel region having a fifth active width and a sixth active width, wherein the fifth active width is measured along a direction that is parallel to a direction in which the sixth active width is measured, and wherein the fifth active width is larger than the sixth active width.

18. The structure of claim 17, wherein the fifth active width is equal to the third active width, and the sixth active width is equal to the fourth active width.

19. The structure of claim 17, wherein the fifth active width is not equal to the third active width, and the sixth active width is not equal to the fourth active width.

20. The structure of claim 15, further comprising an interface layer disposed between the gate electrode and the first L-shaped channel region.

* * * * *